US010700491B2

(12) United States Patent

Sakai et al.

(10) Patent No.: US 10,700,491 B2

(45) Date of Patent: Jun. 30, 2020

(54) SEMICONDUCTOR LASER, LIGHT SOURCE DEVICE, IMAGE FORMING APPARATUS, IMAGE DISPLAY DEVICE, OBJECT DEVICE, AND COLORED-LIGHT GENERATION METHOD

(71) Applicant: Ricoh Company, Ltd., Tokyo (JP)

(72) Inventors: Kohji Sakai, Tokyo (JP); Miho Higuchi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/086,909

(22) PCT Filed: Apr. 19, 2017

(86) PCT No.: PCT/JP2017/015787

§ 371 (c)(1),
(2) Date: Sep. 20, 2018

(87) PCT Pub. No.: WO2017/188100

PCT Pub. Date: Nov. 2, 2017

(65) Prior Publication Data

US 2019/0097396 A1 Mar. 28, 2019

(30) Foreign Application Priority Data

Apr. 25, 2016 (JP) ................................ 2016-086832

(51) Int. Cl.

*H01S 3/13* (2006.01)
*H01S 5/0687* (2006.01)
(Continued)

(52) U.S. Cl.

CPC .......... *H01S 5/0687* (2013.01); *H01S 5/0652* (2013.01); *H01S 5/0653* (2013.01);
(Continued)

(58) Field of Classification Search

CPC .. H01S 5/4093; H01S 5/06804; H01S 5/0683; H01S 5/4012; H01S 5/06832;
(Continued)

(56) References Cited

U.S. PATENT DOCUMENTS

| | | | | |
|---|---|---|---|---|
| 5,802,222 A | 9/1998 | Rasch et al. | | |
| 2002/0080833 A1 * | 6/2002 | Matsuura ............ | G02B 6/4201 372/20 | |

(Continued)

FOREIGN PATENT DOCUMENTS

| | | | |
|---|---|---|---|
| CN | 1146841 A | 4/1997 | |
| CN | 102472895 A | 5/2012 | |

(Continued)

OTHER PUBLICATIONS

S. Nakamura, et al.: "Room-temperature continuous-wave operation of InGaN multi-quantum-well structure laser diodes with a lifetime of 27 hours", Applied Physics Letters, A I P Publishing LLC, US, vol. 70, No. 11, pp. 1417-1419, Mar. 17, 1997.

(Continued)

*Primary Examiner* — Kinam Park

(74) *Attorney, Agent, or Firm* — Xsensus LLP

(57) ABSTRACT

A semiconductor laser is for generating colored light. The semiconductor laser oscillates in a longitudinal multimode. A width of a wavelength band with an intensity equal to or more than −20 dB relative to a peak intensity in a spectrum distribution of output light is equal to or less than 15 nm. A light source device may include The semiconductor laser; a wavelength estimating device configured to estimate a wavelength λ of light from the semiconductor laser; and an emission-light intensity setting unit configured to set an emission light intensity of the semiconductor laser in accordance with an estimation result by the wavelength estimating device.

19 Claims, 12 Drawing Sheets

(51) Int. Cl.

| | |
|---|---|
| ***H01S 5/068*** | (2006.01) |
| ***H01S 5/0683*** | (2006.01) |
| ***H01S 5/065*** | (2006.01) |
| ***H01S 5/40*** | (2006.01) |
| *H01S 5/00* | (2006.01) |
| *H01S 5/06* | (2006.01) |

(52) U.S. Cl.
CPC ........ *H01S 5/0683* (2013.01); *H01S 5/06804* (2013.01); *H01S 5/06832* (2013.01); *H01S 5/4012* (2013.01); *H01S 5/4093* (2013.01); *H01S 5/0071* (2013.01); *H01S 5/0617* (2013.01); *H01S 2301/08* (2013.01); *H01S 2301/16* (2013.01)

(58) Field of Classification Search
CPC .... H01S 5/0687; H01S 5/0652; H01S 5/0653; H01S 2301/08
See application file for complete search history.

(56) References Cited

U.S. PATENT DOCUMENTS

| | | | | |
|---|---|---|---|---|
| 2002/0085595 | A1* | 7/2002 | Ksendzov | H01S 5/141 372/20 |
| 2002/0118715 | A1* | 8/2002 | Kimura | H01S 5/147 372/36 |
| 2003/0206145 | A1 | 11/2003 | Spoonhower et al. | |
| 2011/0128602 | A1 | 6/2011 | Hamano et al. | |
| 2011/0243167 | A1* | 10/2011 | Castillo | H01S 5/06804 372/34 |
| 2012/0098819 | A1* | 4/2012 | Furuya | G02B 5/32 345/212 |
| 2014/0078474 | A1 | 3/2014 | Nakao et al. | |
| 2014/0285586 | A1* | 9/2014 | Fukuda | B41J 2/175 347/85 |
| 2016/0134850 | A1 | 5/2016 | Nakao et al. | |
| 2016/0139416 | A1* | 5/2016 | Yamakawa | G02B 26/101 359/634 |
| 2017/0276546 | A1 | 9/2017 | Sakai et al. | |
| 2018/0067308 | A1 | 3/2018 | Sakai | |

FOREIGN PATENT DOCUMENTS

| | | |
|---|---|---|
| CN | 103676145 A | 3/2014 |
| JP | 2010-276742 | 12/2010 |
| JP | 5304380 | 7/2013 |
| JP | 2015-148665 | 8/2015 |
| JP | 2017-183690 | 10/2017 |
| JP | 2017-199710 | 11/2017 |
| JP | 2018-005162 | 1/2018 |
| JP | 2018-041849 | 3/2018 |
| WO | 2014/208441 A1 | 12/2014 |

OTHER PUBLICATIONS

W. Streifer, et al.: "Longitudinal mode spectra of diode lasers", Applied Physics Letters, vol. 40, No. 4, pp. 305-307, Feb. 15, 1982 (4 total pages).

International Search Report and Written Opinion dated Aug. 16, 2017 in PCT/JP2017/015787 filed on Apr. 19, 2017.

Office Action dated Feb. 6, 2020, issued in corresponding Chinese Patent Application No. 201780025544.5, with English Translation, 23 pages.

* cited by examiner

[Fig. 1]
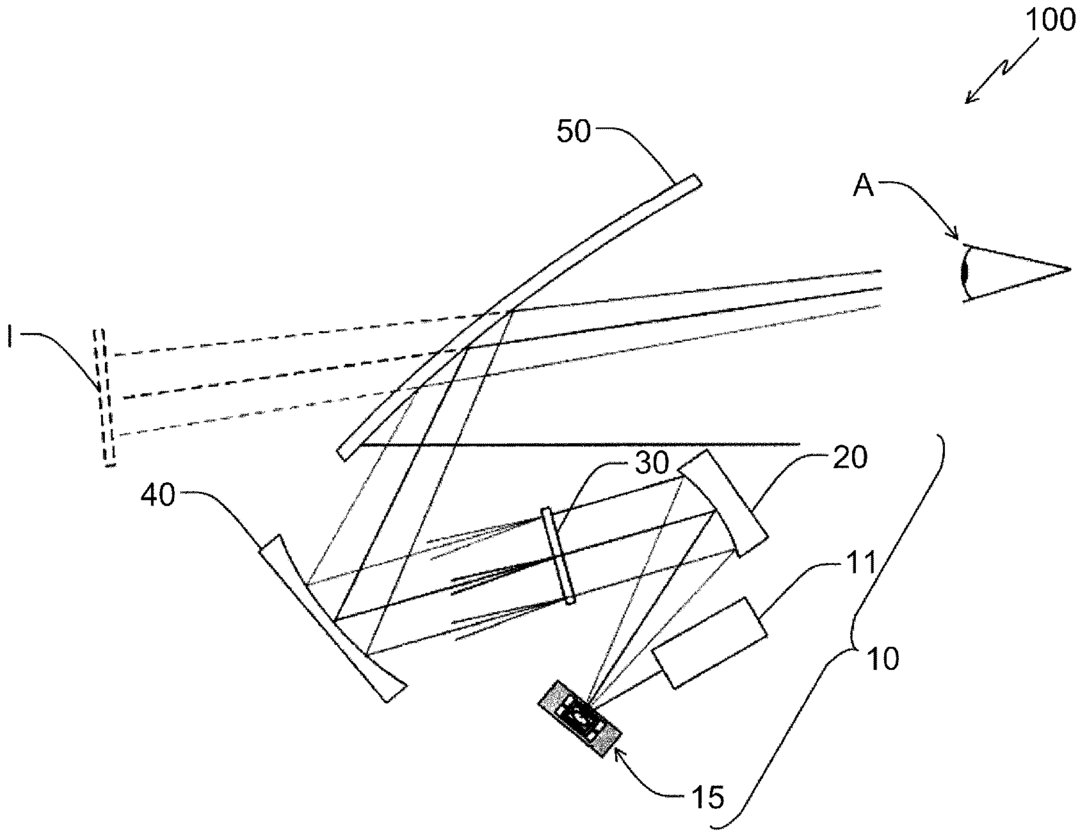
[Fig. 2]
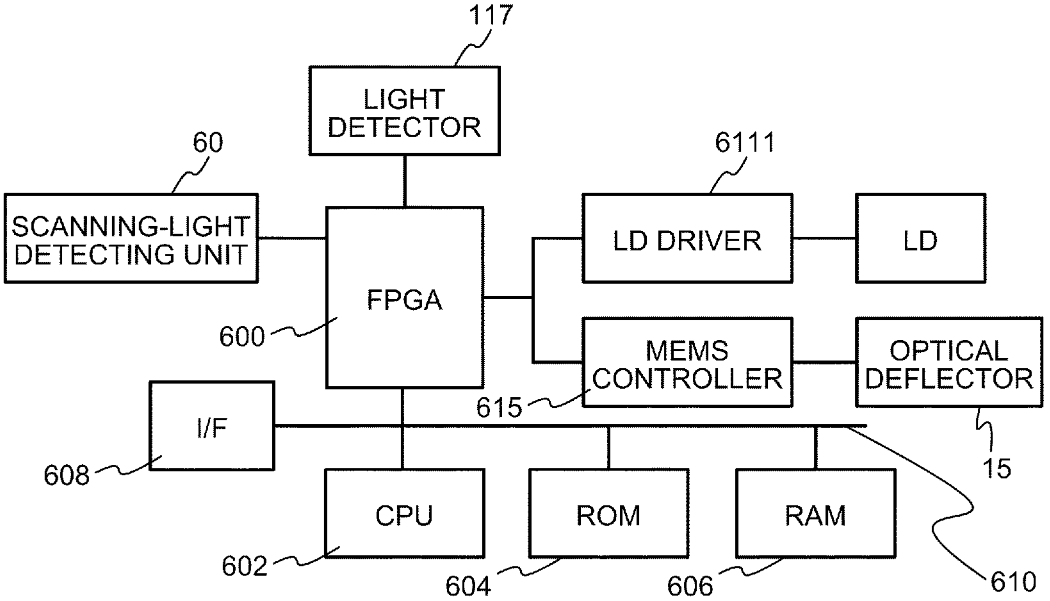

[Fig. 3]
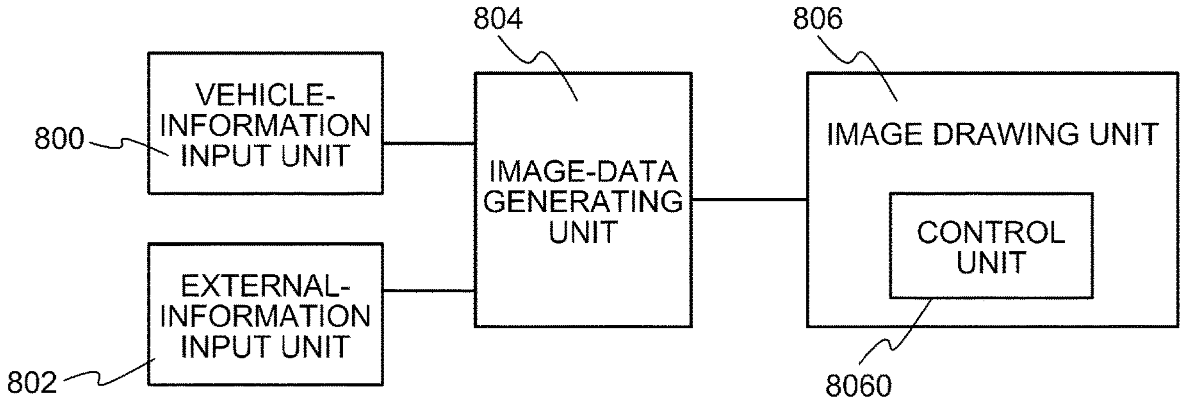
[Fig. 4]
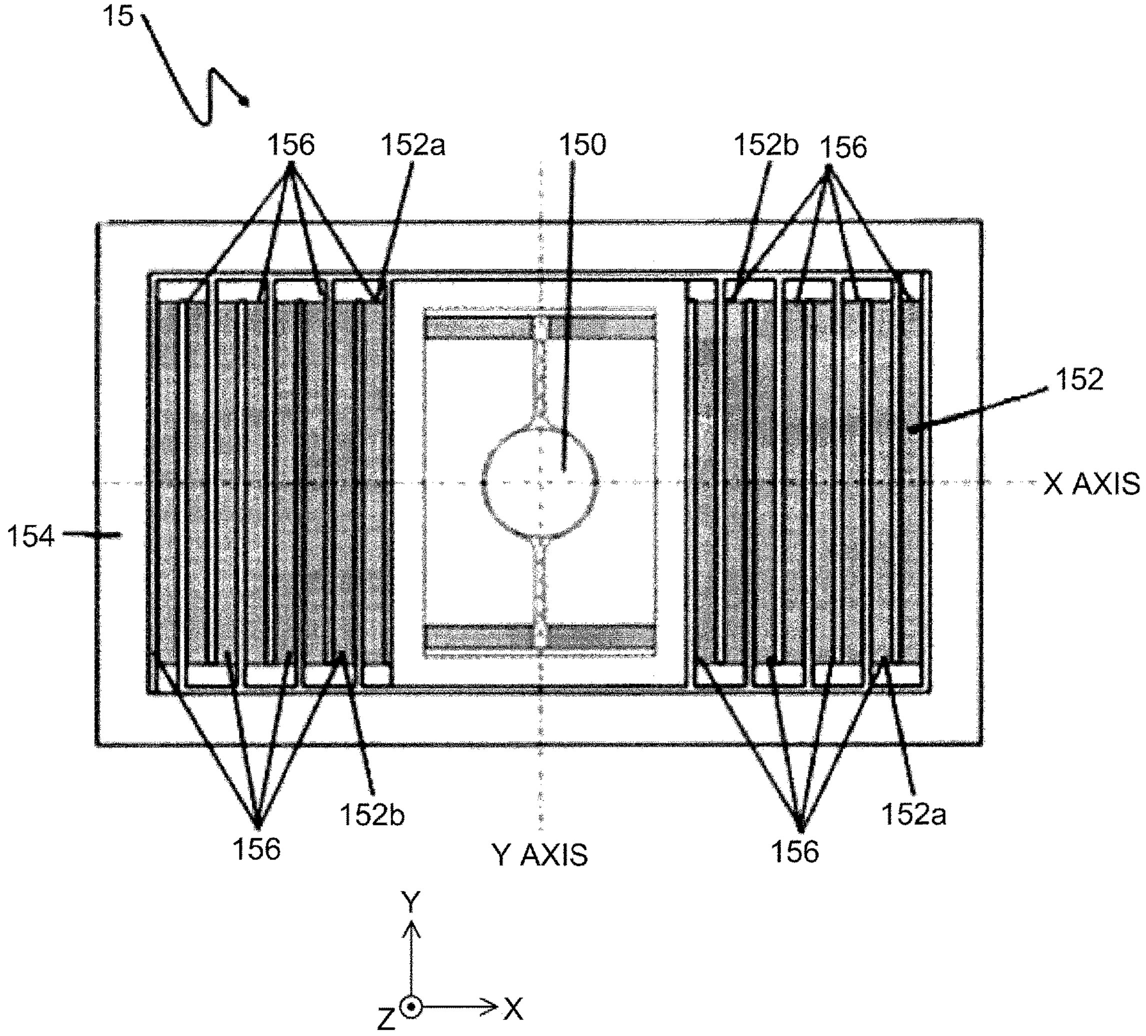

[Fig. 5]
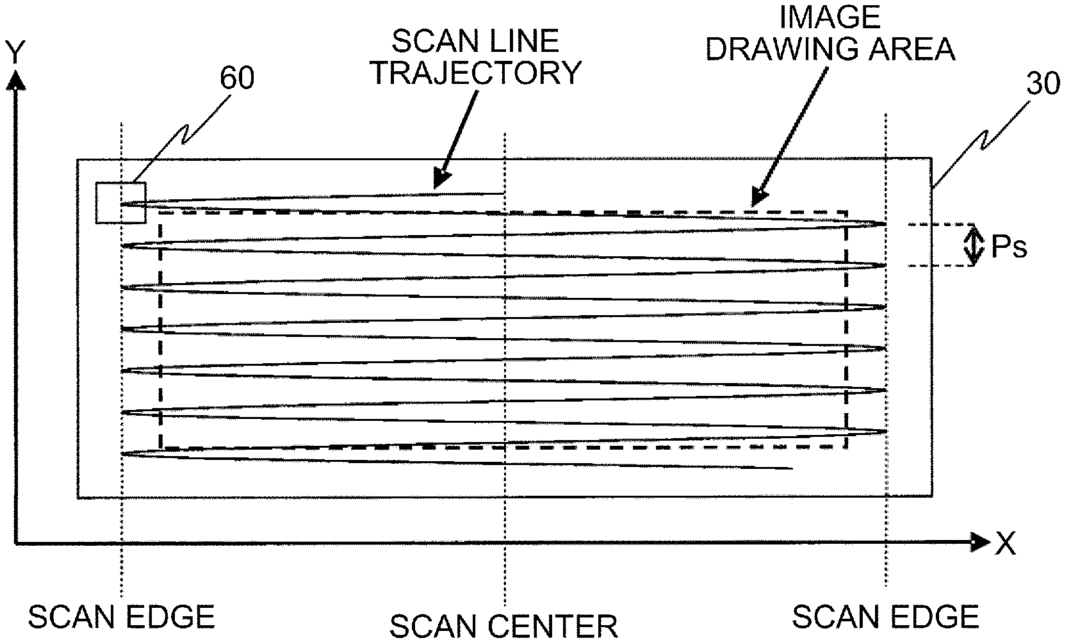

[Fig. 6]
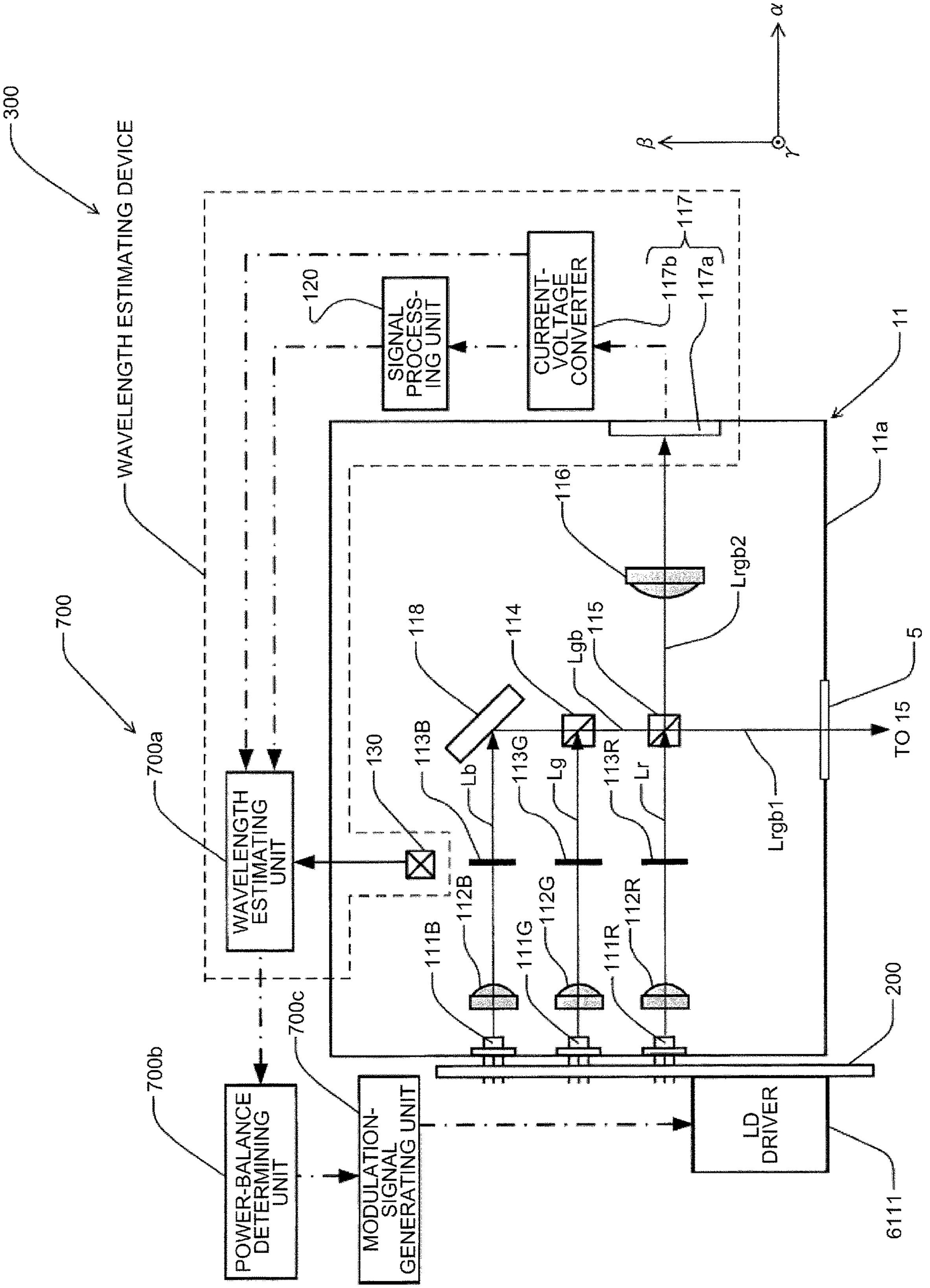

[Fig. 7]
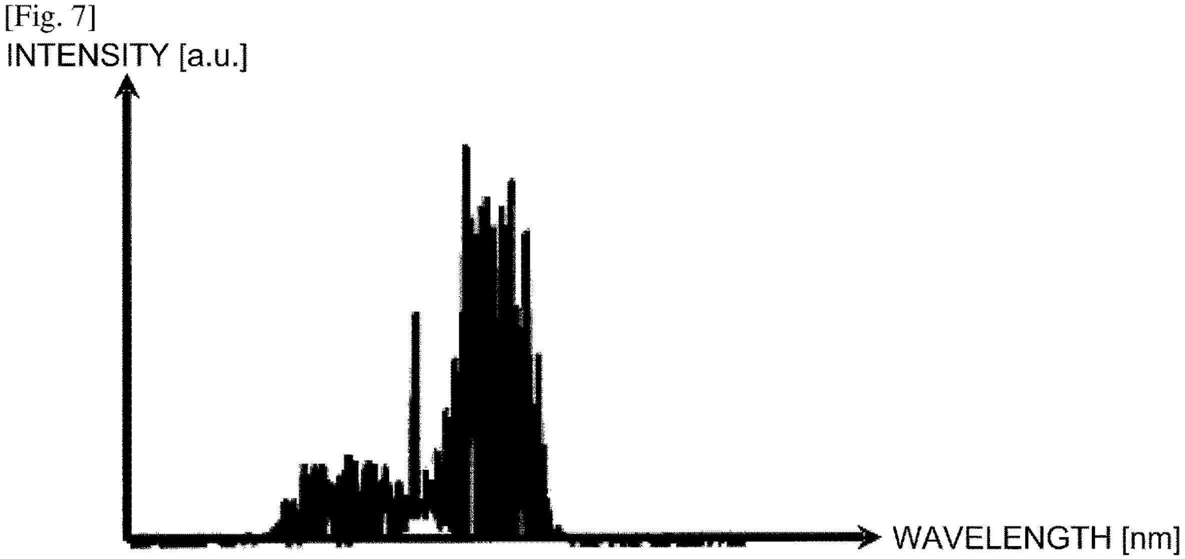
[Fig. 8]
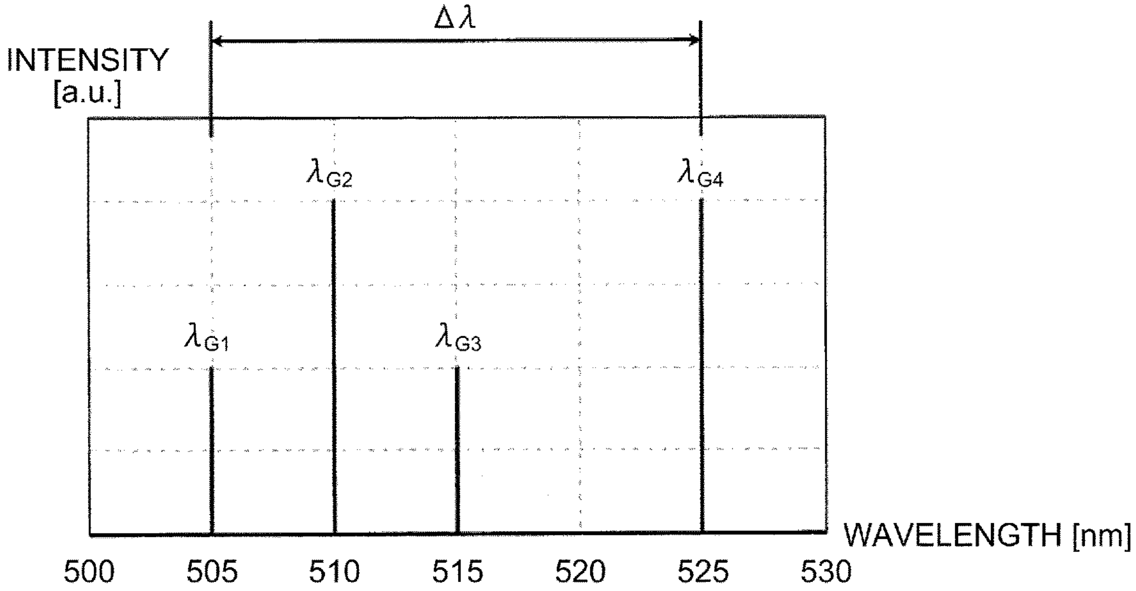

[Fig. 9]
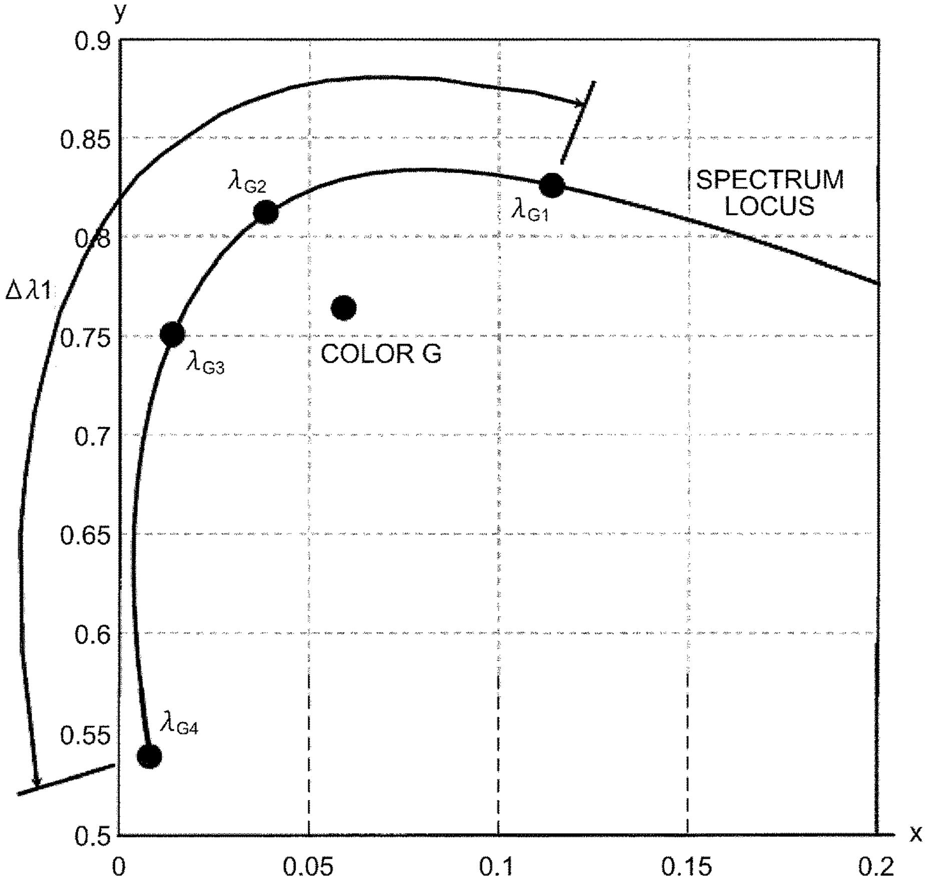
[Fig. 10]
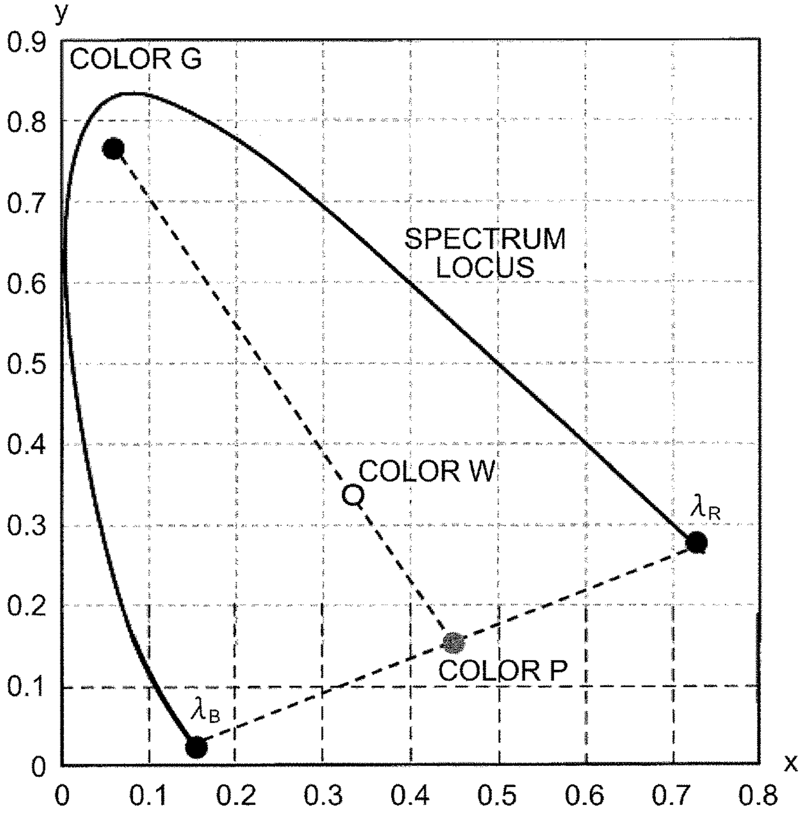

[Fig. 11]
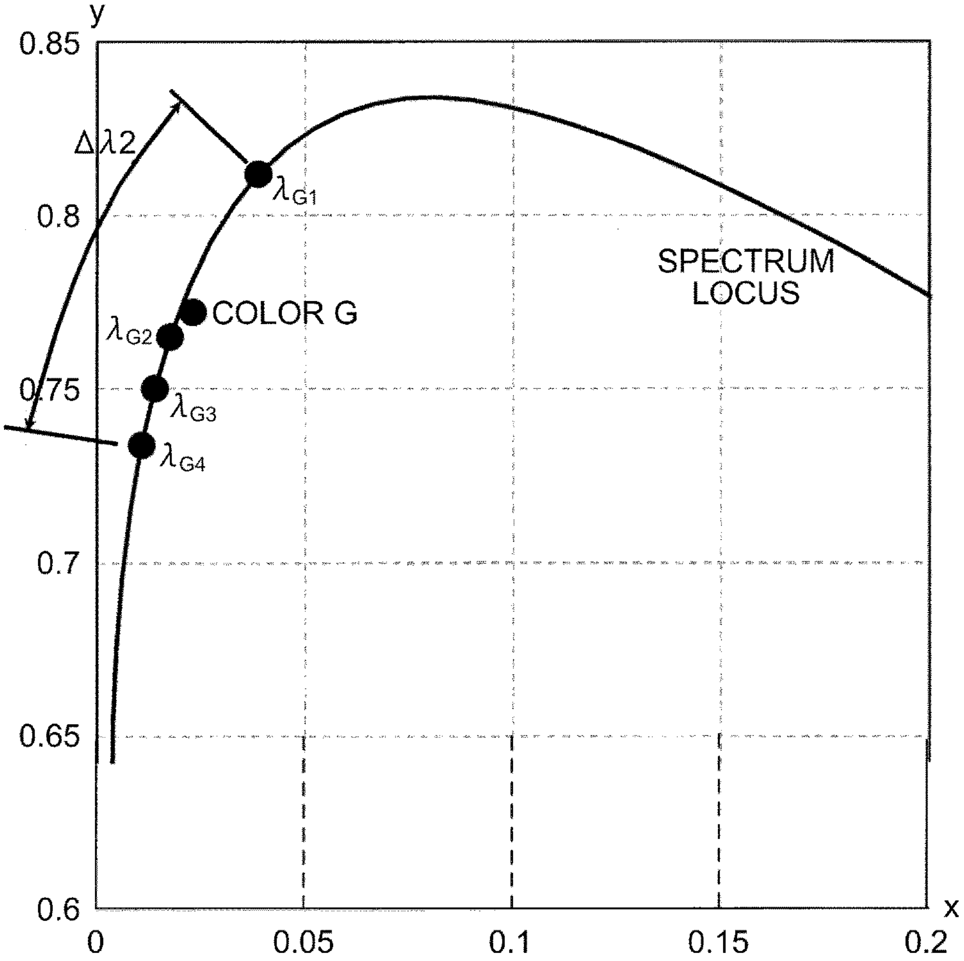
[Fig. 12]
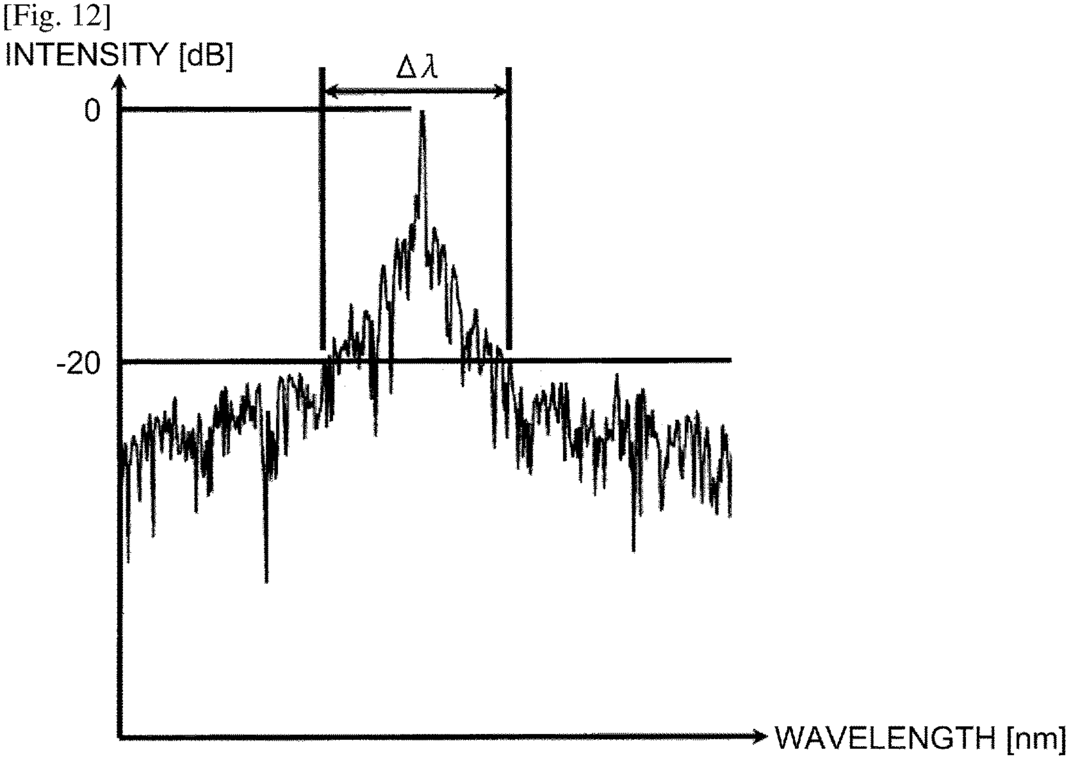

[Fig. 13]
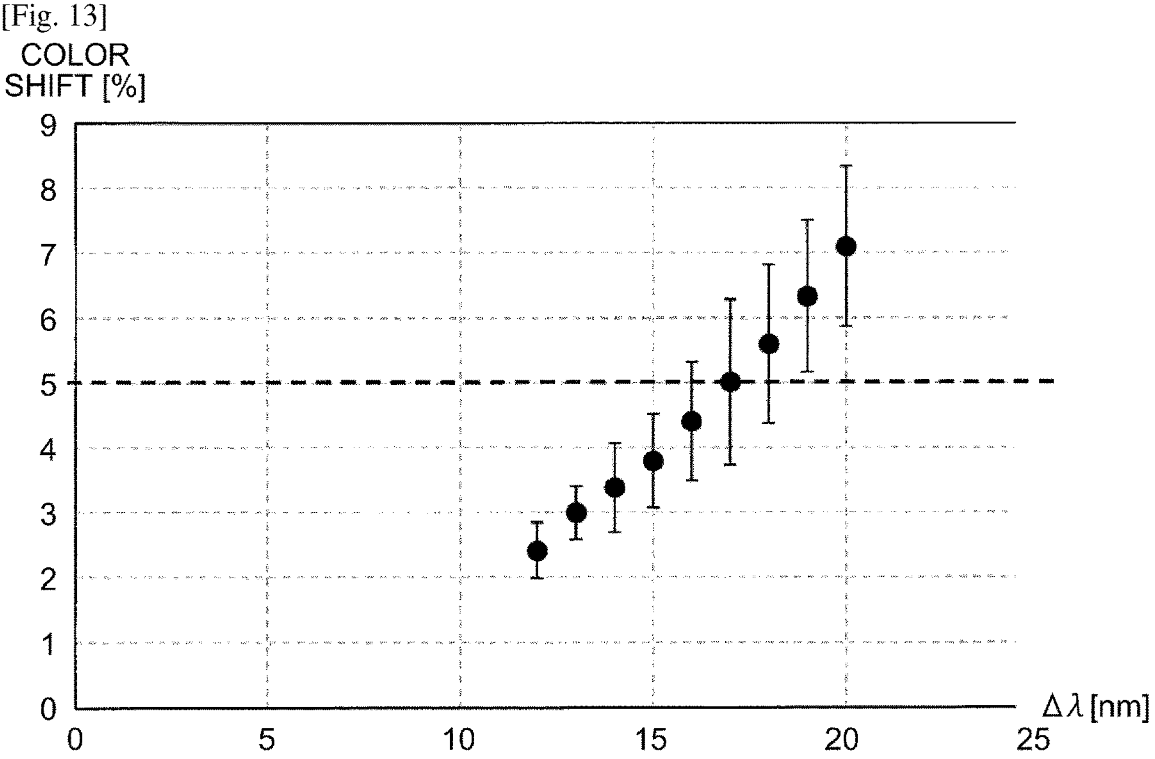
[Fig. 14]
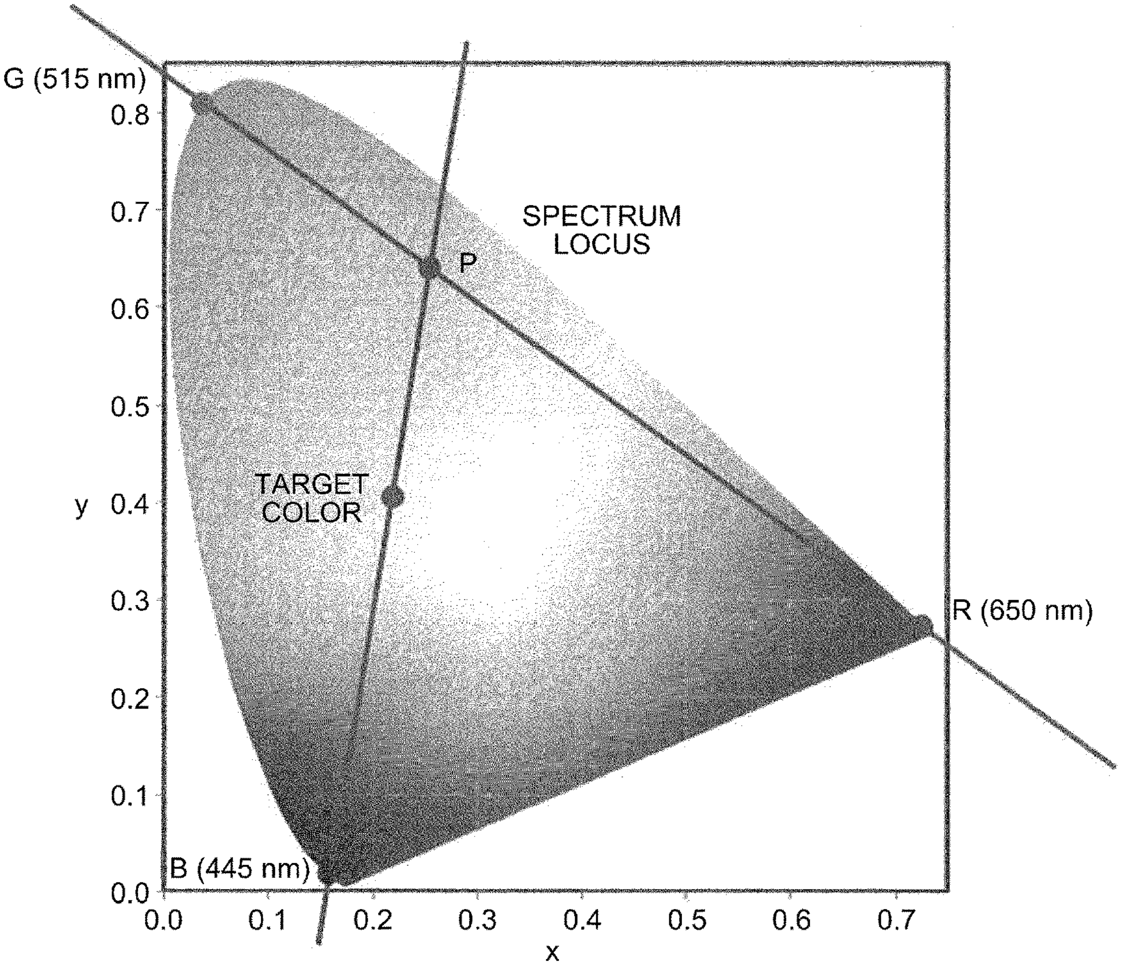

[Fig. 15]
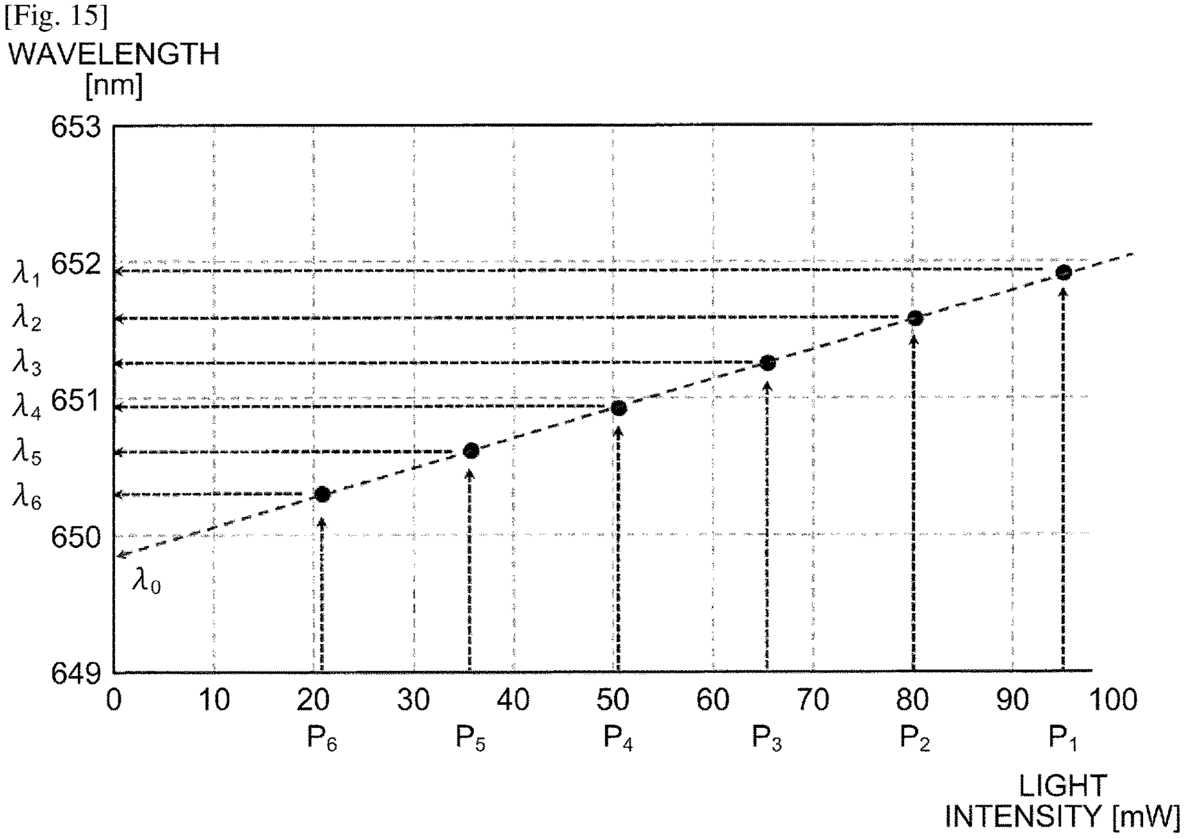

[Fig. 16]
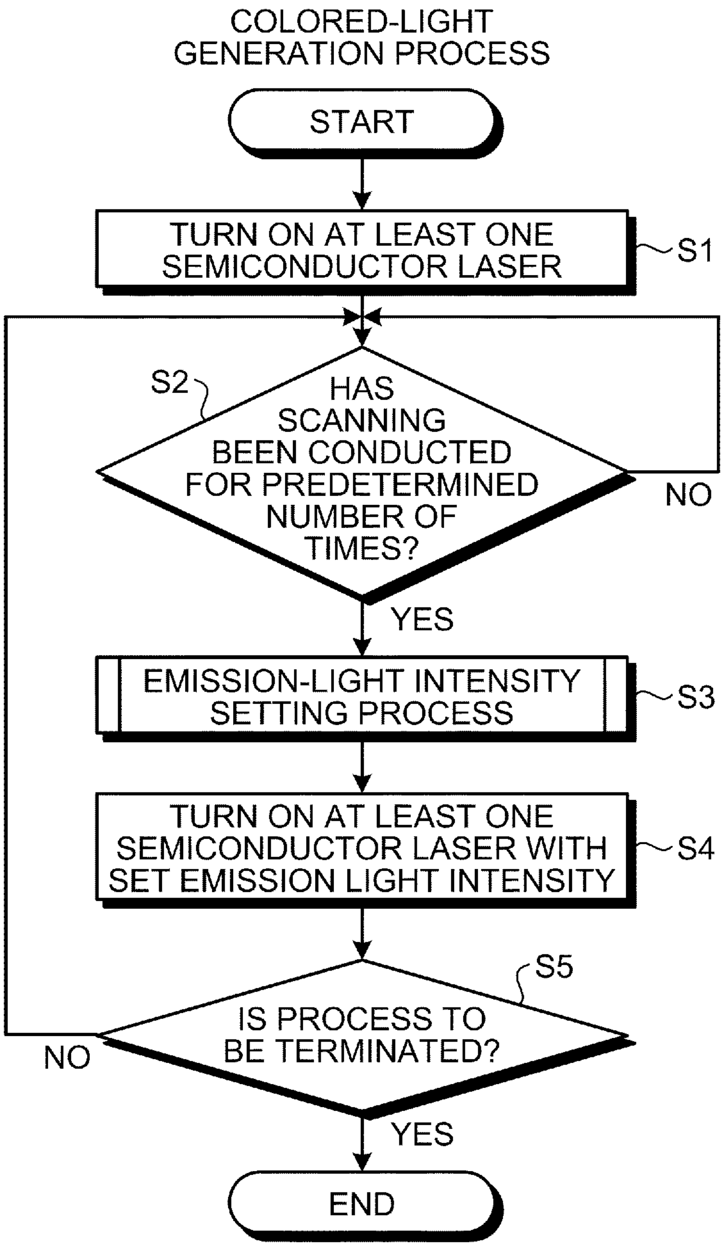

[Fig. 17]
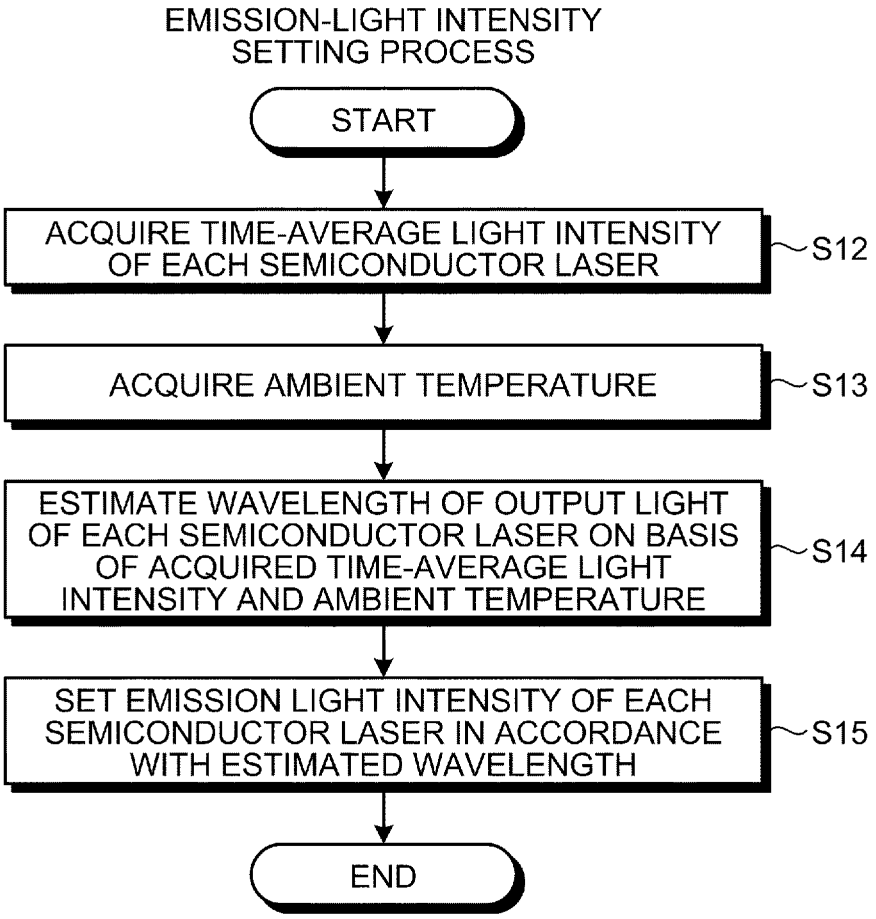

[Fig. 18]
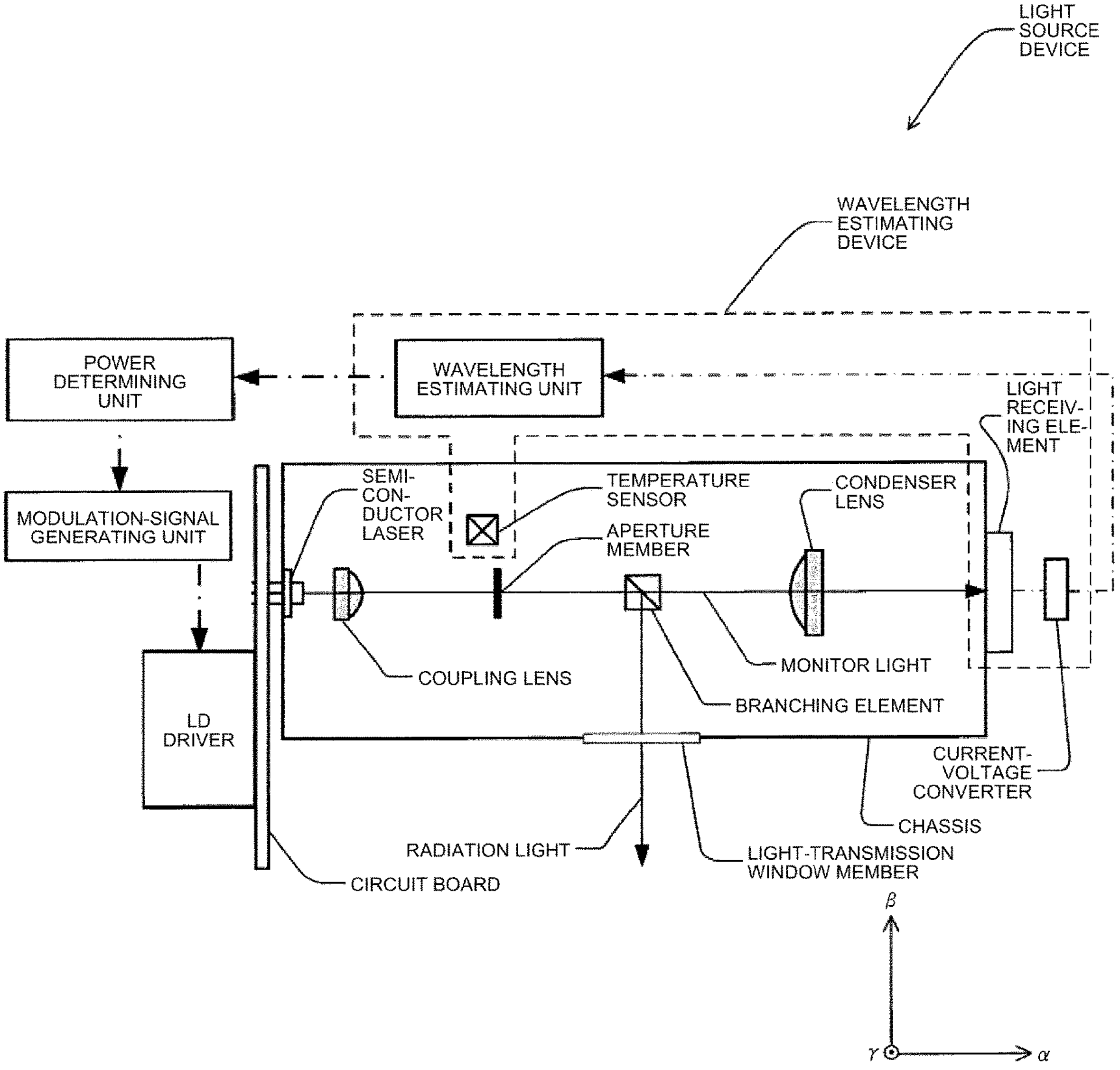

SEMICONDUCTOR LASER, LIGHT SOURCE DEVICE, IMAGE FORMING APPARATUS, IMAGE DISPLAY DEVICE, OBJECT DEVICE, AND COLORED-LIGHT GENERATION METHOD

TECHNICAL FIELD

The present invention relates to a semiconductor laser, a light source device, an image forming apparatus, an image display device, an object device, and a colored-light generation method.

BACKGROUND ART

Semiconductor lasers that are used to generate colored light have been known (for example, see Patent Literatures 1, 2).

Some of the semiconductor lasers oscillate in the longitudinal multimode, and others oscillate in the longitudinal single mode.

SUMMARY OF INVENTION

Technical Problem

However, particularly in the case of colored light generation using a semiconductor laser that oscillates in the longitudinal multimode, there is room for improvement with regard to prevention of color shift.

Solution to Problem

According to one aspect of the present invention, a semiconductor laser is for generating colored light. The semiconductor laser oscillates in a longitudinal multimode. A width of a wavelength band with an intensity equal to or more than −20 dB relative to a peak intensity in a spectrum distribution of output light is equal to or less than 15 nm.

Advantageous Effects of Invention

According to one aspect of the present invention, color shift can be prevented.

BRIEF DESCRIPTION OF DRAWINGS

FIG. 1 is a view that illustrates the schematic configuration of an HUD device according to an embodiment.

FIG. 2 is a block diagram that illustrates the hardware configuration of a control system of the HUD device.

FIG. 3 is a functional block diagram of the HUD device.

FIG. 4 is a view that illustrates an optical deflector of the HUD device.

FIG. 5 is a view that illustrates an example of the scan line trajectory during two-dimensional scanning.

FIG. 6 is a diagram that illustrates a light source device of the HUD device.

FIG. 7 is a diagram that illustrates an example of the spectrum distribution of a semiconductor laser that oscillates in the longitudinal multimode.

FIG. 8 is a diagram that illustrates an example of the spectrum distribution of a green semiconductor laser that oscillates in the longitudinal multimode.

FIG. 9 is a diagram that illustrates that it is difficult to represent color G using the green semiconductor laser that oscillates in the longitudinal multimode.

FIG. 10 is a diagram that illustrates the method for generating color W using a green semiconductor laser that oscillates in the longitudinal multimode, a red semiconductor laser that oscillates in the longitudinal single mode, and a blue semiconductor laser that oscillates in the longitudinal single mode.

FIG. 11 is a diagram that illustrates that color G can be represented by narrowing the wavelength bandwidth of the green semiconductor laser that oscillates in the longitudinal multimode.

FIG. 12 is a diagram that illustrates the wavelength bandwidth Δλ that has an intensity equal to or more than −20 dB relative to the peak intensity, in the spectrum distribution of the green semiconductor laser that oscillates in the longitudinal multimode.

FIG. 13 is a graph that illustrates the relationship between the wavelength bandwidths Δλ of the green semiconductor lasers which oscillate in the longitudinal multimode, and color shifts.

FIG. 14 is the chromaticity diagram that explains the steps of setting the emission light intensity of each semiconductor laser.

FIG. 15 is a diagram that illustrates the method of obtaining the reference wavelength.

FIG. 16 is a flowchart that illustrates a colored-light generation process.

FIG. 17 is a flowchart that illustrates an emission-light intensity setting process.

FIG. 18 is a diagram that illustrates a light source device according to a modified example 1.

DESCRIPTION OF EMBODIMENTS

With reference to the drawings, an HUD device 100 as an image display device according to an embodiment will be described below. Here, the "HUD" is an abbreviation for "head-up display".

FIG. 1 schematically illustrates the overall configuration of the HUD device 100 according to the present embodiment.

<The Overall Configuration of the HUD Device>

Here, the projection methods of the head-up display include the "panel method" to form an intermediate image using an imaging device, such as a liquid crystal panel, DMD panel (digital mirror device panel), or vacuum fluorescent display (VFD), and the "laser scanning method" to conduct scanning with a laser beam output from the laser light source using a two-dimensional scanning device to form an intermediate image. Contrary to the panel method that forms an image by partial light shielding of the entire-screen light emission, the latter laser scanning method particularly enables allocation of emission/non emission to each pixel; therefore, high-contrast images can be generally formed.

Thus, the HUD device 100 uses the "laser scanning method". Of course, also the above-described "panel method" can be used as the projection method.

The HUD device 100 is installed in a movable body, such as a vehicle, an aircraft, or a ship, and enables the navigation information (e.g., the information on the speed of the movable body, the traveling direction, the distance to the destination, the name of the present location, the presence or absence or the position of an object in front of the movable body, the sign for the limiting speed, or the like, or the traffic jam information), which is necessary to operate the movable body, to be viewed via a front windshield 50 (see FIG. 1) of the movable body. In this case, the front windshield 50 also serves as a transmissive reflective member that transmits part of the incident light and that reflects at least part of the remainder. An example where the HUD device is installed in a car that includes the front windshield 50 will be mainly described below.

As illustrated in FIG. 1, the HUD device 100 includes an optical scanning unit 10 including a light source unit 11, an optical deflector 15, and a scanning mirror 20 (e.g., a concave mirror), a screen 30, and a concave mirror 40, and irradiates the front windshield 50 with light (image light) for forming an image, to enable a virtual image I to be viewed from the viewing location of a viewer A (here, the driver who is an occupant of the car). That is, the viewer A can view the image (intermediate image), formed (drawn) on the screen by the optical scanning unit 10, as the virtual image I via the front windshield 50.

For example, the HUD device 100 is located in the lower section of the dashboard of the car, and the distance from the viewing location of the viewer A to the front windshield 50 is about a few dozen cm to 1 m at most.

Here, the concave mirror 40 is designed using the existing optical design simulation software such that the concave mirror 40 has a certain light-gathering power such that the image location of the virtual image I is a desired location.

In the HUD device 100, the light-gathering power of the concave mirror 40 is set such that the virtual image I is displayed at the position (depth position) apart from the viewing location of the viewer A by a distance equal to or more than 1 m and equal to or less than 10 m (preferably, equal to or less than 6 m).

Furthermore, in general, the front windshield is not planar but is slightly curved. Therefore, the curved surfaces of the concave mirror 40 and the front windshield 50 determine the image location of the virtual image I.

In the light source unit 11, laser lights in three colors, R, G, and B, modulated on the basis of the image data, are combined. Part of the combined light, which is the combination of the laser lights in three colors, is guided to the reflective surface of the optical deflector 15. The optical deflector 15 is an MEMS scanner that is manufactured using a semiconductor manufacturing process, or the like, and includes a single micro mirror that is swingable independently around two axes that are perpendicular to each other. Furthermore, the optical deflector 15 may be the combination of two MEMS scanners each including a micro mirror that is swingable around one axis. Moreover, not only the MEMS scanner, but also for example a Galvano scanner or a polygon mirror may be used as the scanner. The details of the light source unit 11 and the optical deflector 15 are described later.

The light (part of the above-described combined light) from the light source unit 11 on the basis of the image data is deflected by the optical deflector 15 and is reflected by the scanning mirror 20 while being prevented from being spread so that the screen 30 is irradiated with the light. Then, optical scanning is conducted on the screen 30 so that an intermediate image is formed on the screen 30. Furthermore, it is preferable that the concave mirror 40 is designed and arranged so as to compensate for optical distortion elements that cause the horizontal line of an intermediate image to have a convex shape in an upward or downward direction due to the effect of the front windshield 50.

After passing through the screen 30, the light is reflected by the concave mirror 40 toward the front windshield 50. Part of the light flux which is incident to the front windshield 50, is transmitted through the front windshield 50, and at least part of the remainder is reflected toward the viewing location (eye point) of the viewer A. As a result, the viewer A can view the virtual image I, which is enlargement of the intermediate image, via the front windshield 50. That is, the virtual image I is displayed beyond the front windshield 50 in an enlarged size from the viewer's eyes.

Furthermore, also if a combiner is provided as a transmissive reflective member closer to the viewing location of the viewer A than the front windshield 50 and the combiner is irradiated with light from the concave mirror 40, virtual image display can be conducted in the same manner as in the case where only the front windshield 50 is provided.

<The Hardware Configuration of the Control System of the HUD Device>

FIG. 2 represents a block diagram that illustrates the hardware configuration of a control system of the HUD device 100. As illustrated in FIG. 2, the control system of the HUD device 100 includes an FPGA 600, a CPU 602, a ROM 604, a RAM 606, an I/F 608, a bus line 610, an LD driver 6111, and an MEMS controller 615.

The FPGA 600 includes an LD control circuit 700 that controls an LD, described later, via an LD driver 6111 on the basis of image data, output of a light detector 117, described later, or output of a signal processing unit 120, and output of a scanning-light detecting unit 60; and an optical-deflector control circuit that controls the optical deflector 15 via the MEMS controller 615. The CPU 602 controls each function of the HUD device 100. The ROM 604 stores an image processing program that is executed by the CPU 602 to control each function of the HUD device. The RAM 606 is used as a work area of the CPU 602. The I/F 608 is an interface to communicate with an external controller, or the like, and connects to, for example, the CAN (Controller Area Network) of the car.

<The Functional Block of the HUD Device>

FIG. 3 represents a block diagram that illustrates functions of the HUD device 100. As illustrated in FIG. 3, the HUD device 100 includes a vehicle-information input unit 800, an external-information input unit 802, an image-data generating unit 804, and an image drawing unit 806. Vehicle information (information on the speed, the travel distance, the distance to an object, the brightness of the outside world, or the like) is input to the vehicle-information input unit 800 from the CAN, or the like. Outside-vehicle information (navigation information from the GPS, or the like) is input to the external-information input unit 802 from external networks. The image-data generating unit 804 generates image data of images to be drawn on the basis of the information that is input from the vehicle-information input unit 800 and the external-information input unit 802, and sends the image data to the FPGA 600. The image drawing unit 806 includes a control unit 8060, and the control unit 8060 transmits a control signal with which the FPGA 600 starts or terminates image drawing.

<The Configuration of the Optical Deflector>

FIG. 4 illustrates the configuration of the optical deflector 15. The optical deflector 15 is an MEMS scanner that is manufactured using a semiconductor process and, as illustrated in FIG. 4, includes a mirror 150 that has a reflective surface, and a pair of serpentine sections 152 that include multiple beams, arranged in the direction of the X axis, where two adjacent beams are connected via a turn section to be serpentine. Two adjacent beams, a beam A (152*a*) and a beam B (152*b*) in each of the serpentine sections 152 are supported by a frame member 154. The beams are individually provided with multiple piezoelectric members 156 (e.g., PZT). Different voltages are applied to the piezoelectric members of two adjacent beams in each of the serpentine sections so that the two adjacent beams in the serpentine section are bent in different directions, which is accumulated so that the minor 150 is rotated with a large angle around the X axis (=in a vertical direction). With this configuration, optical scanning in a vertical direction with the X axis as a center is possible with a low voltage. On the other hand, in a horizontal direction with the Y axis as a center, optical scanning is conducted based on resonance using a torsion bar, or the like, that is connected to the mirror 150.

By the optical deflector 15 that is configured as described above, scanning (e.g., raster scan) is conducted in two dimensions with the laser beam on the image drawing area of the screen 30 (see FIG. 5), and emission of the LD is controlled in accordance with the scanning position of the laser beam so that drawing on a pixel by pixel basis and display of a virtual image can be conducted. Incidentally, in FIG. 5, Ps is a scan line pitch.

<Optical Scanning, Virtual Image Display>

Only the point image, which corresponds to the laser beam diameter, is instantaneously projected from the HUD device 100; however, as scanning is conducted at an extremely high speed, a residual image sufficiently remains in the human's eyes within one frame image. Using this residual image phenomenon, the driver experiences perception as if an image is projected on the "display area". In actuality, the image appearing on the screen 30 is reflected by the concave minor 40 and the front windshield 50 so that the driver perceives the image as a virtual image on the "display area". Due to this mechanism, if the image is not to be displayed, emission of the LD may be stopped. Specifically, it is possible that the luminance at the point other than the point where the virtual image is displayed on the "display area" is substantially 0.

That is, the image location of the virtual image by the HUD device 100 is any location within the predetermined "display area" on which the virtual image can be formed. The "display area" is determined according to the specification in designing of the HUD device.

As described above, the use of the "laser scanning method" makes it possible to implement measures of, for example, turning off the LD or reducing the light intensity for other than the area that is to be displayed, as display is not necessary there.

By contrast, according to the "panel method" that represents an intermediate image using an imaging device, such as a liquid crystal panel or a DMD panel, the entire panel needs to be lighted up; therefore, even if the image signal represents black display to make non-display, it is difficult to achieve complete 0 because of the characteristics of the liquid crystal panel or the DMD panel. Therefore, black portions are sometimes seen such that the black portions are raised; however, with the laser scanning method, it is possible to eliminate such rising of the black portions.

Here, as illustrated in FIG. 5, the scanning-light detecting unit 60 is provided on the peripheral area of the image drawing area (also referred to as "effective scanning area") of the screen 30. The scanning-light detecting unit 60 is provided to detect operations of the optical deflector 15, and is used to detect the scanning timing (the scanning position of beam) when the signal area is irradiated with light and to control changes in the characteristics of the optical deflector 15 due to the environment change or chronological change, thereby keeping the constant image quality. The scanning-light detecting unit 60 includes, for example, a photo diode or a photo transistor. The output signal of the scanning-light detecting unit 60 is delivered to the FPGA 600.

<Light Source Unit>

The light source unit 11 will be described in detail below. FIG. 6 schematically illustrates the configuration of the light source unit 11. In the following explanation, the αβγ three-dimensional orthogonal coordinate system, illustrated in FIG. 6, or the like, is appropriately used.

For example, as illustrated in FIG. 6, the light source unit 11 includes multiple (for example, three) light sources that each include a semiconductor laser that has single or multiple emission points and the package that houses the semiconductor laser. The semiconductor lasers of the three light sources are referred to as semiconductor lasers 111R, 111G, and 111B.

Furthermore, in addition to the above-described three light sources, the light source unit 11 includes multiple (for example, three) coupling lenses 112R, 112G, and 112B, multiple (for example, three) aperture members 113R, 113G, and 113B, two optical-path combining elements 114 and 115, a reflection mirror 118, a condenser lens 116, or the like. Each component of the light source unit 11 is installed in a chassis 11*a*.

Each of the semiconductor lasers is an edge-emitting semiconductor laser (LD: laser diode) that has a different oscillation wavelength band. Specifically, the semiconductor laser 111R is a red semiconductor laser, the semiconductor laser 111G is a green semiconductor laser, and the semiconductor laser 111B is a blue semiconductor laser. Here, the output directions of the semiconductor lasers 111R, 111G, and 111B are all +α direction. Each of the semiconductor lasers is installed on a circuit board 200 on which the LD driver 6111 is provided.

Light fluxes Lr, Lg, Lb, output from the LDs 111R, 111G, and 111B, are coupled into subsequent optical systems by corresponding coupling lenses 112R, 112G, and 112B.

The coupled light fluxes are shaped by corresponding aperture members 113R, 113G, and 113B. The aperture shape of each of the aperture members may be various shapes, such as circular, oval, rectangular, or square, in accordance with the angle of divergence of a light flux, or the like.

The light flux Lb which has passed through the aperture member 113B, is reflected by the reflection minor 118 toward −β direction so that the light flux Lb enters the optical-path combining element 114 (e.g., a dichroic minor).

The optical path of the light flux Lg which has passes through the aperture member 113G, is combined with the optical path of the light flux Lb by the optical-path combining element 114 (e.g., a dichroic minor). Specifically, the light flux Lb which has passed the reflection mirror 118, is transmitted through the center of the optical-path combining element 114 in −β direction, and the light flux Lg which has passed through the aperture member 113G, is reflected at the center of the optical-path combining element 114 in −β direction.

Then, the optical path of a combined light flux Lgb which is the combination of the light flux Lg and the light flux Lb, is combined with the optical path of the light flux Lr which has passed through the aperture member 113R, by the optical-path combining element 115 (e.g., a dichroic minor). Furthermore, although the two optical-path combining elements 114, 115, and the reflection mirror 118 are here separate components, at least two of the two optical-path combining elements 114, 115, and the reflection minor 118 may be integrally installed.

Specifically, part of the combined light flux Lgb is transmitted through the center of the optical-path combining element 115 in −β direction, and the remainder is reflected at the center of the optical-path combining element 115 in +α direction. Part of the light flux Lr which has passed through the aperture member 113R, is reflected at the center of the optical-path combining element 115 in −β direction, and the remainder is transmitted through the center of the optical-path combining element 115 in +α direction.

Specifically, from the optical-path combining element 115, a combined light flux Lrgb1 which is the combination of part of the combined light flux Lgb and part of the light flux Lr, is output in −β direction, and a combined light flux Lrgb2 which is the combination of the remainder of the combined light flux Lgb and the remainder of the light flux Lr is output in +α direction.

The combined light flux Lrgb1 is emitted to the optical deflector 15 via a light-transmission window member 5 that is attached to the peripheral section of the opening of the chassis 11*a* such that the light-transmission window member 5 covers the opening, and is used to draw an image (display a virtual image) on the screen 30. Furthermore, a meniscus lens that has a concave surface facing the optical deflector 15, for example, may be provided between the optical-path combining element 115 and the optical deflector 15.

The combined light flux Lrgb2 is guided to the light detector 117 via the condenser lens 116. The light detector 117 outputs the signal which corresponds to the light intensity of the received combined light flux Lrgb2, to the LD control circuit 700 via the signal processing unit 120 that is described later. The light detector 117 includes a light receiving element 117*a* and a current-voltage converter 117*b* that convers the output current of the light receiving element 117*a* into a voltage signal (received light signal). For example, a photo diode (PD) or a photo transistor can be used as the light receiving element 117*a*.

Subsequent to the current-voltage converter 117*b*, the signal processing unit 120 that computes the time average of a received light signal is provided. The signal processing unit 120 integrates the received light signal which are input during a certain time period T, computes the time average of the integrated value (divide by T), and outputs the averaged value to the LD control circuit 700. Here, the signal processing unit 120 is not necessary, and received light signals from the current-voltage converter 117*b* may be directly output to the LD control circuit 700.

Furthermore, as apparent from FIG. 6, the length of the optical path from each of the semiconductor lasers to the optical-path combining element 115 is different from one another. Specifically, the length of the optical path from the semiconductor laser 111B to the optical-path combining element 115 is longest, and the length of the optical path from the semiconductor laser 111R to the optical-path combining element 115 is shortest. This results from the fact that, if white is formed in a virtual image, the combining ratio of RGB is about 2.5:1:0.5, the light intensity of red needs to be high, and conversely the light intensity of blue may be low, and is to prevent a reduction in the light use efficiency by the semiconductor laser.

The LD control circuit 700 generates a modulation signal (a pulse signal) of each semiconductor laser on the basis of output of the light detector 117 or the signal processing unit 120 and sends the modulation signal to the LD driver 6111. The LD driver 6111 applies the drive current which corresponds to the modulation signal for each semiconductor laser, to the semiconductor laser.

Hereafter, the device that includes the light source unit 11, the light detector 117, the signal processing unit 120, the LD control circuit 700, and the LD driver 6111 is referred to as the "light source device 300".

Here, FIG. 7 illustrates the spectrum distribution of output light of a high-output semiconductor laser that oscillates in the longitudinal multimode. Generally, the spectrum distribution of output light of a high-output semiconductor laser which oscillates in the longitudinal multimode, has many spectra as described here, and it is extremely difficult to determine which wavelength is the oscillation wavelength.

Furthermore, this spectrum distribution is changed in accordance with the ambient temperature around the semiconductor laser and the emission light intensity of the semiconductor laser, and reproducibility is low. Particularly, in the HUD device, as the dynamic range of light and dark in the surrounding environment of the vehicle is large, variations in the emission light intensity which is required to handle the dynamic range, causes high fluctuations in the self temperature, and as the ambient temperature is changed in accordance with the time or the position of the vehicle, the oscillation wavelength fluctuates. That is, the oscillation wavelength of the semiconductor laser has "self-temperature dependency" and "ambient-temperature dependency".

However, this does not mean that it is impossible to generate a color using a high-output semiconductor laser that oscillates in the longitudinal multimode.

For simplification, for example, FIG. 8 illustrates the spectrum distribution of output light of a high-output green semiconductor laser which oscillates in the longitudinal multimode, including four spectra ($\lambda_{G1}$=505 nm, $\lambda_{G2}$=510 nm, $\lambda_{G3}$=515 nm, $\lambda_{G4}$=525 nm). Furthermore, the ratio of the intensities of the spectra of $\lambda_{G1}$, $\lambda_{G2}$, $\lambda_{G3}$, and $\lambda_{G4}$ is 1:2:1:2.

Here, it can be considered that, in the xy chromaticity diagram of FIG. 9, the semiconductor laser has a unique color G that is determined in accordance with the four wavelengths and the intensity ratio between the four wavelengths, and cannot be represented using a single wavelength (the wavelengths $\lambda_{G1}$ to $\lambda_{G4}$ are plotted on the spectrum locus that corresponds to the curved line part in the xy chromaticity diagram).

Therefore, with regard to the color G, for example, white color (color W in FIG. 10) can be generated by combining the oscillation wavelength ($\lambda_R$=653 nm) of the red semiconductor laser, which oscillates in the longitudinal single mode, and the oscillation wavelength ($\lambda_B$=453 nm) of the blue semiconductor laser, which oscillates in the longitudinal single mode.

As a specific example, consideration is given to the case where, in the chromaticity diagram that is illustrated in FIG. 10, color P is the intersection point between the straight line connecting $\lambda_R$ and $\lambda_B$ and the straight line connecting the color G and the color W. In this case, the emission light intensities (outputs) of the semiconductor lasers of $\lambda_R$ and $\lambda_B$ are first set to generate color P, and then the emission light intensity (output) of the semiconductor laser for the color G may be set to generate the color W.

Here, it is assumed that the red semiconductor laser and the blue semiconductor laser oscillate in the longitudinal single mode; however, for this method, the same discussion can be applied to a case where each of the red semiconductor laser and the blue semiconductor laser oscillates in the longitudinal multimode.

However, if the HUD device is installed in a vehicle, such as a car, the environmental temperature can change within an extremely large range, and the luminance of the virtual image, displayed in the HUD device, needs to be changed in accordance with the ambient luminance; therefore, the wavelength (oscillation wavelength) with which the semiconductor laser oscillates is changed.

As described before, in the case of the longitudinal multimode, changes in the spectrum distribution are not uniform, and it is extremely difficult to expect the change. This means that it is extremely difficult to expect the color G of the high-output green semiconductor laser that oscillates in the longitudinal multimode.

Of course, the difficulty can be overcome by building a unit that measures the color G in the HUD device; however, this increases the size of the device, and causes the problem regarding limitations of the installation space within the car.

The fundamental reason why the longitudinal-multimode oscillating high-output green semiconductor laser has the unique color G which cannot be represented by the single wavelength, is that a wavelength bandwidth Δλ1 in the spectrum in FIG. 9 is large.

Therefore, if the wavelength bandwidth Δλ1 is narrowed down to Δλ2, the color G becomes close to the spectrum locus as illustrated in FIG. 11, which allows approximate replacement with a single wavelength. This wavelength, which can be treated as if in a longitudinal single-mode oscillation, is defined as a "proxy wavelength" in this specification.

This proxy wavelength is defined in terms of color generation, and it is enough to use a component that has the intensity that contributes to color generation, in the spectrum distribution of the longitudinal multimode, to discuss the proxy wavelength. As a result of examination, it has been understood that, among a large number of spectra in the spectrum distribution, the spectra that have an intensity less than −20 dB relative to the maximum intensity (peak intensity), hardly contribute to color generation; therefore, the width of the wavelength band (also referred to as the "wavelength bandwidth"), where there are spectra that have an intensity of equal to or more than −20 dB relative to the maximum intensity (0 dB in FIG. 12) illustrated in FIG. 12, is defined as an effective wavelength bandwidth Δλ.

Here, it has been understood that, if a semiconductor laser of Δλ≤15 nm is used, color shift of the output light of the semiconductor laser falls within 5% (see FIG. 13). In FIG. 13, color shift (the vertical axis) has a range in a vertical direction with each plot as the center, which indicates individual difference of the semiconductor laser. From FIG. 13, it is understood that the individual difference is gradually decreased as Δλ becomes smaller.

It can be considered that, if color shift falls within 5%, the color shift cannot be visually identified by humans in general, and it can be said that color reproducibility is sufficient.

As a result, if each semiconductor laser satisfies Δλ≤15 nm, the desired color can be generated by only paying attention to the behavior of the proxy wavelength no matter how the spectrum distribution changes.

Although the proxy wavelength may be defined using the wavelength included in Δλ, it is preferable to use the weighted average wavelength λ that is most correlated to color generation. The weighted average wavelength λ is defined using the following Equation (1), where the wavelengths included in the wavelength band of Δλ are $\lambda_1$, $\lambda_2$, $\lambda_3$, . . . , $\lambda_n$, and the intensities corresponding to the respective wavelengths are $I_1$, $I_2$, $I_3$, . . . , and $I_n$.

$$\lambda=\Sigma(\lambda_k*I_k)/\Sigma(I_k) \quad (1)$$

(where k=1, 2, 3, . . . , n)

With reference back to FIG. 6, the LD control circuit 700 includes a wavelength estimating unit 700*a*, a power-balance determining unit 700*b*, and a modulation-signal generating unit 700*c*.

The wavelength estimating unit 700*a* estimates the wavelength (preferably, the proxy wavelength) of output light of each semiconductor laser on the basis of the output signal (the signal that corresponds to the received light intensity) of the light detector 117 and the output signal of the temperature sensor 130. Thus, the wavelength estimating device includes the wavelength estimating unit 700*a*, the light detector 117, and the temperature sensor 130.

Specifically, the wavelength estimating unit 700*a* monitors the received light intensity $P_{moni}$ by the light receiving element 117*a* (the output signal of the light detector 117) and, with regard to $P_{moni}$, calculates the light use efficiency η from the semiconductor laser to the light receiving element 117*a*, and converts the received light intensity $P_{moni}$ into the emission light intensity P of the semiconductor laser at present ($P=P_{moni}/\eta$).

With regard to the oscillation method of the semiconductor laser, various pulse oscillations are conceivable depending on what kind of information is generated as a virtual image in the HUD device, and the inventor has found out that if the emission light intensity P is defined as "the time-average light intensity that is hourly averaged", the wavelength can be estimated with high accuracy.

Here, as the wavelength of output light of the semiconductor laser has ambient-temperature dependency as described above, it is preferable that the temperature sensor 130 is installed in a position where the ambient temperature of the semiconductor laser can be acquired. Of course, the temperature of the package that houses the semiconductor laser may be monitored, but in that case, it is necessary to perform a process to extract the ambient temperature from the information, and there is a concern that the accuracy with which the wavelength is estimated is decreased.

Furthermore, in order to speed up pulse oscillations of the semiconductor laser, it is preferable that the length of wiring between the LD driver 6111 and the semiconductor laser is short; however, in this case, heat due to driving of the LD driver 6111 propagates to the ground layer of the circuit board 200 and facilitates a rise in the temperature of the semiconductor laser. Specifically, the temperature of the package which houses the semiconductor laser, is the temperature that is the combination of the three temperature components, i.e., the ambient temperature, the temperature of the semiconductor laser, and the temperature of the LD driver 6111, and therefore it is extremely difficult to extract the ambient temperature from this temperature.

Therefore, according to the present embodiment, for example, the temperature sensor 130 is provided near the aperture member 113B that is apart from each semiconductor laser to a certain extent, and within the chassis 11*a*. It is obvious that the temperature sensor 130 may be provided at a different position, e.g., near a different aperture member, near a reflection mirror, near an optical-path combining element, or near a condenser lens; in either case, the temperature sensor 130 is preferably installed within a proper distance to measure the ambient temperature around the semiconductor laser.

The temperature sensor 130 may be any temperature sensor that is capable of measuring the ambient temperature around the semiconductor laser, and includes, for example, a thermocouple, thermistor, resistance temperature detector, or radiation thermometer.

The inventor focused attention on that the temperature dependency of the wavelength of output light is linear regardless of the type of semiconductor laser and found out that, using this property, the wavelength of output light of the semiconductor laser can be estimated accurately.

Therefore, according to the present embodiment, the ambient temperature around the semiconductor laser is monitored using the temperature sensor 130 and the emission light intensity of the semiconductor laser is monitored using the light detector 117 so that the wavelength of output light of each semiconductor laser is estimated in terms of both "ambient-temperature dependency" and "self-temperature dependency".

Specifically, the wavelength estimating unit 700*a* monitors the measured temperature of the temperature sensor 130 in addition to monitoring of the received light intensity in the light receiving element 117*a*, and estimates the current wavelength of output light of the semiconductor laser.

Here, the current wavelength λ of output light of the semiconductor laser is represented by the following Equation (2), where $\lambda^{(0)}$: reference wavelength α: ambient temperature coefficient $T_a$: current ambient temperature $T_a^{(0)}$: ambient temperature during measurement of the reference wavelength β: light-intensity coefficient P: current emission light intensity $P^{(0)}$: emission light intensity during measurement of the reference wavelength.

$$\lambda=\lambda^{(0)}+\alpha*(T_a-T_a^{(0)})+\beta*(P-P^{(0)}) \quad (2)$$

It is preferable that the reference wavelength $\lambda^{(0)}$ is the above-described weighted average wavelength. In this case, the current wavelength λ is substantially the above-described weighted average wavelength (proxy wavelength).

By using the above-described Equation (2), the current wavelength λ can be accurately estimated, no matter which value the current ambient temperature and the current emission light intensity have.

If the condition of pulse generated by the semiconductor laser is always fixed, the reference wavelength $\lambda^{(0)}$ may be the wavelength that is acquired under "a certain single condition" with any ambient temperature $T_a^{(0)}$ and any light intensity $P^{(0)}$; however, various types of information are generated as virtual images in the HUD device 100, and furthermore the luminance of a virtual image in the HUD device 100 needs to be changed in accordance with the brightness outside the vehicle, and therefore, in general it is unlikely that pulse oscillations occur under the fixed single condition.

In this case, it is preferable that the reference wavelength $\lambda^{(0)}$ is defined as a theoretical wavelength in $P^{(0)}=0$[W]. This is because the common situation under all the pulse conditions is not other than $P^{(0)}=0$[W].

It is obvious that it is impossible to actually measure the wavelength under the condition of $P^{(0)}=0$[W] but, as illustrated in FIG. 15, the emission light intensity of the semiconductor laser is changed to $P_1, P_2, \ldots, P_5$, and $P_6$, and linear interpolation is conducted using corresponding wavelengths $\lambda_1, \lambda_2, \ldots, \lambda_5$, and $\lambda_6$ so that the theoretical wavelength in $P^{(0)}=0$[W] can be determined, and the theoretical wavelength is the reference wavelength $\lambda^{(0)}$. Here, if it is during an extremely short time, it can be considered that the ambient temperature is substantially constant; therefore, a measurement error of the reference wavelength hardly occurs.

Furthermore, in FIG. 15, the emission light intensity of the semiconductor laser is changed in 6 stages and the wavelength is measured at each stage; however, this is not a limitation, that is, it is possible that the emission light intensity of the semiconductor laser is changed in at least 2 stages and the wavelength is measured at each stage. Most of the LDs have extremely good linearity; therefore, the reference wavelength can be obtained as the intersection point (intercept) between the vertical axis and the straight line passing through two plots that are obtained when the wavelength is measured at for example two stages (low emission light intensity and high emission light intensity).

Furthermore, the oscillation wavelengths of the semiconductor lasers with the same oscillation wavelength band (the same color) have individual difference within the range of about ±5 nm; therefore, it is preferable that the reference wavelength is measured with regard to individual semiconductor laser.

On the other hand, the temperature coefficient α and the light-intensity coefficient β are each determined to be a fixed value for each color as there is hardly individual difference between the semiconductor lasers. It is obvious that, in order to increase the accuracy with which the wavelength is estimated, the temperature coefficient α and the light-intensity coefficient β may be previously measured for each individual, to write the measured value in the firmware of the wavelength estimating unit 700*a*.

The process to obtain the reference wavelength, illustrated in FIG. 15, is performed for each semiconductor laser using a wavelength measuring device (e.g., a spectrum analyzer). The acquired reference wavelength, the ambient temperature during measurement of the reference wavelength, and the emission light intensity during measurement of the reference wavelength are substituted into the above-described Equation (2). Specifically, the values of the acquired reference wavelength and the ambient temperature and the emission light intensity during measurement of the reference wavelength are written in the firmware of the wavelength estimating unit 700*a*.

The wavelength estimating unit 700*a* monitors received light intensities $P_{moni}^{(red)}$, $P_{moni}^{(green)}$, and $P_{moni}^{(blue)}$ of light, which are output from the semiconductor lasers 111R, 111G, and 111B at different timings and received by the light receiving element 117*a* at different timings, and calculates the current emission light intensities $P^{(red)}$, $P^{(green)}$, and $P^{(blue)}$ of the semiconductor lasers from the monitor information $P^{(red)}$, $P_{moni}^{(red)}/\eta^{(red)}$, $P^{(green)}=P_{moni}^{(green)}/\eta^{(green)}$, $P^{(blue)}=P_{moni}^{(blue)}/\eta^{(blue)}$).

Then, the wavelength estimating unit 700*a* uses the above-described Equation (2) to calculate the current wavelength λ of light, output from each semiconductor laser, on the basis of the information on the current ambient temperature $T_a$ in the temperature sensor 130, and sends the calculation result to the power-balance determining unit 700*b*.

On the basis of the color of each pixel in the image data and the current wavelengths of the three semiconductor lasers, the power-balance determining unit 700*b* sets the emission light intensity of each semiconductor laser to obtain a suitable (appropriate) power balance so as to generate light in the color, and sends the set value to the modulation-signal generating unit 700*c*.

Specifically, if the current wavelengths of the three semiconductor lasers 111R, 111G, and 111B are 650 nm, 515 nm, and 445 nm, respectively, in the chromaticity diagram illustrated in FIG. 14, for example, the emission light intensities of two semiconductor lasers out of the three semiconductor lasers 111R, 111G, and 111B are appropriately determined to generate the certain color P, and the emission light intensity of the remaining semiconductor laser is set to an appropriate value which depends on the color P, so as to obtain a desired color (target color). It is possible to generate all the colors in the triangle that has three points of 650 nm, 515 nm, and 445 nm as vertices in FIG. 14. The edge of the horseshoe shape in FIG. 14 is called "spectrum locus", and is the line where the wavelength corresponds to the color.

On the basis of the emission light intensity, which is set by the power-balance determining unit 700*b*, of each semiconductor laser, and the image data, the modulation-signal generating unit 700*c* generates a modulation signal for each of the semiconductor lasers and outputs the modulation signal to the LD driver 6111 at a predetermined timing on the basis of the output signal from the scanning-light detecting unit 60.

Thus, the power balance of output lights from the three semiconductor lasers is made appropriate so that the combined light in the desired color is generated, the image drawing area is scanned with the combined light, and the virtual image in the desired color is displayed.

That is, it is possible to display high-quality color virtual images that truly reproduce the color information on each pixel in the image data.

Colors of virtual images have been explained above; with regard to the luminance of virtual images, it is possible to control virtual images so as to have the desired color and the desired luminance by uniformly increasing or decreasing each of the emission light intensities in accordance with output of a brightness sensor which acquires the brightness around the car, for example, while keeping the ratio of the set emission light intensities of the three semiconductor lasers 111R, 111G, and 111B constant. Here, it is preferable that, as the output of the brightness sensor is higher, the emission light intensity of each semiconductor laser is set to be higher.

With reference to FIG. 16, a colored-light generation process (virtual-image display process) using the light source device 300 according to the present embodiment will be described below. The flowchart of FIG. 16 is based on the processing algorithm that is executed by the LD control circuit 700. The colored-light generation process is started when the electric system of the car which is provided with the HUD device 100 is turned on and the HUD device 100 is started up, for example. After the HUD device 100 is started up, the optical deflector 15 starts to operate.

At the first Step S1, at least one of the semiconductor lasers is turned on. Specifically, the modulation-signal generating unit 700*c* generates a modulation signal for the semiconductor laser to be turned on, in accordance with the color of each pixel in the image data, and outputs the modulation signal to the LD driver 6111 at a predetermined timing based on the output signal of the scanning-light detecting unit 60. As a result, the drive current is applied to the semiconductor laser in accordance with the modulation signal of the semiconductor laser to be turned on, and drawing of the image which corresponds to the image data, on the screen 30 and display of the virtual image are started.

At the next Step S2, it is determined whether scanning has been conducted for a predetermined number of times. Specifically, the number of times of scanning for two ways or one way in the main scanning direction is counted on the basis of the output signal of the scanning-light detecting unit 60 and the horizontal scanning frequency of the optical deflector 15 and, if the number of counts reaches a predetermined number, a transition is made to the next Step S3. That is, until the number of times of scanning reaches a predetermined number of times, a stand-by state is maintained. Furthermore, the "predetermined number of times" may be one time to the number of times of two-way scanning corresponding to at least one frame in the case of counting in unit of two-way scanning, and may be one time to the number of times of one-way scanning corresponding to at least one frame in the case of counting in unit of one-way scanning At Step S3, the "emission-light intensity setting process" is performed. The details of the emission-light intensity setting process are given later.

At the next Step S4, at least one of the semiconductor lasers is turned on with the set emission light intensity. Specifically, the turn-on target semiconductor laser is turned on with the emission light intensity that is set at Step S3. Thus, the power balance of output lights from the three semiconductor lasers is made appropriate, and virtual images in the desired color are displayed.

At the next Step S5, it is determined whether the process is to be terminated. If the electric system of the car which is provided with the HUD device 100, is on, a negative determination is made here and the processing is returned to Step S2 and, when the electric system is turned off, a positive determination is made here and the flow is terminated.

Furthermore, although it is determined whether scanning has been conducted for a predetermined number of times at Step S2 of the above-described colored-light generation process, instead of this, it may be determined whether a predetermined time has elapsed.

With reference to FIG. 17, the "emission-light intensity setting process" at Step S3 of the above-described colored-light generation process will be described below. The flowchart of FIG. 17 is based on the processing algorithm that is executed by the LD control circuit 700. The emission-light intensity setting process is performed during the period of time in which the effective scanning area (image drawing area) is not irradiated with scanning light (the period of time in which images are not drawn), such as the time when a peripheral area around the effective scanning area is irradiated with scanning light, or the time when a transition is made between successive frames.

At the first Step S12, the time-average light intensity of each semiconductor laser is acquired. Specifically, the signal obtained by averaging the received light signal over time is acquired from the signal processing unit 120.

At the next Step S13, the ambient temperature is acquired. Specifically, the measured temperature of the temperature sensor 130 is acquired.

At the next Step S14, the wavelength $\lambda$ of output light of each semiconductor laser is estimated on the basis of the acquired time-average light intensity (the current emission light intensity) and the ambient temperature (the current ambient temperature). Specifically, the wavelength $\lambda$ is estimated using the above-described Equation (2).

At the next Step S15, the emission light intensity of each semiconductor laser is set in accordance with the estimated wavelength $\lambda$ (see FIG. 14).

The above-described semiconductor laser according to the present embodiment is a semiconductor laser that is used to generate colored light (light with a color) and that is characterized in that the semiconductor laser oscillates in the longitudinal multimode and the width of the wavelength band with the intensity equal to or more than −20 dB relative to the peak intensity, in the spectrum distribution of output light is equal to or less than 15 nm.

In this case, the width of the wavelength band with the intensity that contributes to generation of colored light is narrow such that the wavelength (oscillation wavelength), with which the semiconductor laser oscillates, can be approximated to a single wavelength.

As a result, the treatment can be made in the same manner as in the longitudinal single mode, and a unique color of the semiconductor laser can be properly represented using a single wavelength. That is, a unique color of the semiconductor laser can be limited in a pinpoint manner.

As a result, with the semiconductor laser according to the present embodiment, color shift can be prevented.

Furthermore, with the light source device 300 that includes the multiple (for example, three) semiconductor lasers 111R, 111G, and 111B which have different oscillation wavelength bands, and a light combining unit that includes the optical-path combining elements 114, 115, provided on the optical path of light from the semiconductor lasers, desired colored light (single colored light or multicolored light) can be generated.

Moreover, the light source device 300 further includes the light receiving element 117*a* that receives light from the semiconductor laser; the temperature sensor 130 that measures the ambient temperature around the semiconductor laser; the wavelength estimating device (an estimating unit) that estimates the wavelength λ of light from the semiconductor laser on the basis of the received light intensity in the light receiving element 117*a* and the measurement result of the temperature sensor 130; and the power-balance determining unit 700*b* (an emission-light intensity setting unit) that sets the emission light intensities of the semiconductor lasers in accordance with the estimation result of the wavelength estimating device.

In this case, desired colored light can be generated in a stable manner while preventing an increase in the size of the device (for example, without installing a large-sized device such as a wavelength measuring device).

Furthermore, it is preferable that the LD control circuit 700 sets the emission light intensities of the semiconductor lasers on the basis of the wavelength λ that is estimated for each semiconductor laser and is included in the above-described wavelength band.

In this case, as is the case with the longitudinal single mode, it is possible to set the emission light intensities of the semiconductor lasers easily and accurately.

Furthermore, it is preferable that, if the wavelengths included in the above-described wavelength band are $\lambda_1, \lambda_2, \lambda_3, \ldots, \lambda_n$ and the intensities corresponding to the respective wavelengths in the spectrum are $I_1, I_2, I_3, \ldots, I_n$, $\lambda=\Sigma(\lambda_k*I_k)/\Sigma(I_k)$ (where k=1, 2, 3, . . . , n) is satisfied.

In this case, desired colored light can be generated accurately.

Furthermore, the above-described wavelength λ does not need to be the above weighted average wavelength, that is, the wavelength λ may be any wavelength included in the above-described wavelength bandwidth. For example, the wavelength λ may be the wavelength with the peak intensity.

Furthermore, it is preferable that the light source device 300 further includes a light branching unit including the optical-path combining element 115, provided on the optical path of light that has passed through the light combining unit, and the light receiving element 117*a* is provided on the optical path of light that is output from the semiconductor laser and that passes through the light combining unit and the light branching unit. Incidentally, the light combining unit and the light branching unit share the optical-path combining element 115 in FIG. 6.

In this case, the wavelength λ of light from each semiconductor laser can be estimated using the same (single) light receiving element 117*a*.

Furthermore, with the HUD device 100 (the image display device) that includes the light source device 300; the optical deflector 15 (image forming element) that forms an image with light from the light source device 300; and the screen 30 that is irradiated with light that forms the image, it is possible to form the image with high color reproducibility.

Furthermore, the HUD device 100 further includes the concave mirror 40 (projecting unit) that projects light which has passed through the screen 30, toward the front windshield 50 (transmissive reflective member); therefore, a virtual image with high color reproducibility can be displayed.

Furthermore, with the movable device that includes the HUD device 100 and the movable body that is provided with the HUD device 100, information using a virtual image with high color reproducibility can be given to the driver of the movable body.

Moreover, the colored-light generation method according to the present embodiment is a colored-light generation method for generating colored light using the multiple (for example, three) semiconductor lasers 111R, 111G, and 111B that have different oscillation wavelength bands, and includes a process to turn on the semiconductor lasers and a process to combine light from the semiconductor lasers.

In this case, the width of the wavelength band with the intensity that contributes to colored-light generation is narrow such that the wavelength (oscillation wavelength) with which the semiconductor laser oscillates, can be approximated to a single wavelength.

As a result, the treatment can be made in the same manner as in the longitudinal single mode, and a unique color of the semiconductor laser can be properly represented using a single wavelength. That is, a unique color of the semiconductor laser can be limited in a pinpoint manner.

As a result, with the colored-light generation method according to the present embodiment, color shift can be prevented.

Furthermore, it is preferable that the colored-light generation method according to the present embodiment further includes a process to estimate the wavelength λ of light from the semiconductor laser and a process to set the emission light intensities of the semiconductor lasers on the basis of the estimation result at the estimating process.

In this case, desired colored light can be generated in a stable manner.

Furthermore, during the above-described setting process, it is preferable that the emission light intensities of the semiconductor lasers are set on the basis of the wavelength λ that is estimated for each of the semiconductor lasers and is included in the above-described wavelength band.

In this case, as is the case with the longitudinal single mode, it is possible to set the emission light intensities of the semiconductor lasers easily and accurately.

Furthermore, it is preferable that, if the wavelengths included in the above-described wavelength band are $\lambda_1, \lambda_2, \lambda_3, \ldots, \lambda_n$ and the intensities corresponding to the respective wavelengths in the spectrum are $I_1, I_2, I_3, \ldots, I_n$, $\lambda=\Sigma(\lambda_k*I_k)/\Sigma(I_k)$ (where k=1, 2, 3, . . . , n) is satisfied.

In this case, desired colored light can be generated accurately.

Furthermore, the above-described wavelength λ does not need to be the above weighted average wavelength, that is, the wavelength λ may be any wavelength included in the above-described wavelength bandwidth. For example, the wavelength λ may be the wavelength with the peak intensity.

Furthermore, although an explanation is given using the light source device 300 including the multiple light sources, as an example in the above-described embodiment, it is also possible to apply the light source device that includes a single semiconductor laser, which is the same as the semiconductor laser according to the above-described embodiment, like the light source device according to a modified example 1, illustrated in FIG. 18. In the case where the single semiconductor laser is used, too, the wavelength of output light is estimated with high accuracy so that the emission light intensity of the light source can be set accurately. The use of the light source device including the single semiconductor laser, is applied to, for example, image forming apparatuses that form a two-color image, or image display devices that display a two-color image.

In this case, a wavelength estimating unit estimates the wavelength of output light from the light source, a power setting unit calculates the emission light intensity in accordance with the estimation result, and a modulation-signal generating unit generates a modulation signal in accordance with the calculation result; thus, the light source can be turned on with desired emission light intensity, and color shift can be prevented.

In the above explanation, the wavelength of output light from the semiconductor laser is estimated on the basis of both the ambient-temperature dependency and the self-temperature dependency of the wavelength of the output light; however, according to a modified example 2, in the environment where it can be considered that, for example, the ambient temperature of the semiconductor laser is substantially the same, the wavelength of the output light may be estimated only on the basis of the self-temperature dependency (only on the basis of the received light intensity of the light receiving element 117*a* or the averaged light intensity). In this case, the temperature sensor does not need to be provided.

Here, it is assumed that "the environment where it can be considered that the ambient temperature of the semiconductor laser is substantially the same" is a case where the temperature inside the vehicle which is provided with the HUD device 100, is kept to be substantially the same due to air conditioning, or a case where the temperature of the room is kept to be substantially the same due to air conditioning when a head-mounted display device, a prompter device, or a projector device as the image display device that includes the light source device including the light source and the wavelength estimating device according to the present invention, is used in the room.

Specifically, the wavelength of output light can be estimated using the following Equation (3).

$$\lambda=\lambda^{(0)}+\beta*(P-P^{(0)}) \tag{3}$$

where λ: current wavelength $\lambda^{(0)}$: reference wavelength

β: light-intensity coefficient

P: current emission light intensity $P^{(0)}$: emission light intensity during measurement of the reference wavelength In this case, too, the reference wavelength can be obtained in the same manner as in the above-described embodiment (see FIG. 15). In this case, with regard to the semiconductor laser that oscillates in the longitudinal multimode, the wavelength to be estimated may be, for example, the above-described weighted average wavelength or may be the wavelength with the peak intensity.

Furthermore, according to the above-described embodiment and each of the modified examples, the wavelength of light from each semiconductor laser is estimated using the wavelength estimating device that includes the light receiving element and the temperature sensor; however, this is not a limitation. For example, it is possible that, instead of the wavelength estimating device, a wavelength measuring device is provided at the subsequent stage of the condenser lens in FIG. 6 or FIG. 18, the wavelength λ (preferably the proxy wavelength) is calculated on the basis of the measurement result (the spectrum distribution of light from the semiconductor laser) by the wavelength measuring device when the semiconductor lasers are turned on at different timings, and the emission light intensities of the semiconductor lasers are controlled in accordance with the wavelength λ. Furthermore, the wavelength measuring device may include, for example, a superheterodyne-type spectrum analyzer that uses an optical bandpass filter, or a spectroscope that includes a prism or a diffraction grating.

Furthermore, the multiple wavelength estimating devices or the multiple wavelength measuring devices may be provided corresponding to the multiple semiconductor lasers. For example, a branching element (for example, a cover glass that covers an opening (output opening) of the package that houses the semiconductor laser, a half mirror, or a beam splitter) may be configured to cause light from each semiconductor laser to branch to enter the corresponding wavelength estimating device or the corresponding wavelength measuring device.

Furthermore, if an edge-emitting semiconductor laser is used as the semiconductor laser, the light output from one edge may be used for image formation or virtual-image display, and the light output from the other edge may be input to the corresponding wavelength estimating device or the corresponding wavelength measuring device.

Furthermore, both the light receiving element and the wavelength measuring device may be provided. Specifically, part of the light from each semiconductor laser may be used for image formation and virtual image display, another part may be guided into the wavelength measuring device, and the remainder may be guided into the light receiving element. In this case, it is possible that the power balance of the semiconductor lasers is determined on the basis of a measurement result by the wavelength measuring device, for example, and the absolute values of the emission light intensities (outputs) of the semiconductor lasers may be set in accordance with the received light intensity by the light receiving element.

Furthermore, according to the above-described embodiment and the modified examples, the wavelength estimating device does not need to be a component of the light source device. For example, the light source device can include only the light source unit 11.

Furthermore, the semiconductor laser or the light source device including the semiconductor laser according to the present invention can be used as a light source for exposure in an image forming apparatus, such as a color printer, or a color copier which conducts exposure (e.g., optical scanning) on a photoconductor that is, for example, an image bearer, to form an image. That is, the image forming apparatus that includes the semiconductor laser and the light source device according to the present invention can be configured. In this case, an image in a desired color can be formed. In this case, a polygon scanner or a Galvano scanner as well as an MEMS scanner can be used as the image forming element that forms an image with light from the semiconductor laser.

Furthermore, according to the above-described embodiment and the modified examples, the LD (edge-emitting semiconductor laser) is used as the semiconductor laser; however, other semiconductor lasers, such as a surface-emitting semiconductor laser (VCSEL), may be used.

Furthermore, according to the above-described embodiment and the modified examples, the projecting unit includes the concave minor 40; however, this is not a limitation and, for example, the projecting unit may include a convex minor.

Furthermore, according to the above-described embodiment and the modified examples, the scanning mirror 20 is provided; however, the scanning minor 20 does not need to be provided. Specifically, it is possible that the screen 30 is irradiated with light, deflected by the optical deflector 15, directly or via a convex lens without turning the optical path. Furthermore, a plain mirror may be used as the scanning mirror 20.

Furthermore, the transmissive reflective member may be not only the front windshield of a movable body but also, for example, a side windshield or a rear windshield, that is, it is preferable that the transmissive reflective member is a window member (windshield) that is provided in a movable body so that a person in the movable body views outside of the movable body.

Furthermore, in the explanation according to the above-described embodiment and each of the modified examples, the image display device (HUD) is for installation in movable bodies, such as vehicles, aircrafts, or vessels, that is, it is enough that the image display device is for installation in an object. Here, in addition to movable bodies, the "objects" include the ones that are constantly installed or the ones that can be transported.

Furthermore, although the present invention is preferably applied to the HUD device as described in the above embodiment, the present invention is applicable to not only the HUD device but also, for example, head-mounted display devices, prompter devices, or projector devices. In this case, too, it is possible to generate desired colored light.

For example, in the case of application to the projector device, the projector device can be configured in the same manner as the HUD device 100. Specifically, image light, which has passed the concave mirror 40, is projected onto a movie screen, a wall surface, or the like. Furthermore, image light, which has passed the screen 30, may be projected onto a movie screen, a wall surface, or the like, without providing the concave mirror 40. Furthermore, a mirror with a free-form surface may be used instead of the concave minor 40.

Furthermore, the semiconductor laser, the light source device, the image forming apparatus, the image display device, the object device, and the colored-light generation method according to the present invention are not limited to the configuration and the method that are explained in the above embodiment and the modified examples, and can be appropriately changed.

The thinking process by which the inventor has developed the above-described embodiment and the modified examples will be described below.

There are known head-up display devices (hereafter, also referred to as the "HUD devices") that generate image light, irradiate the windshield of a movable body such as a vehicle with the image light, and display a virtual image.

For example, Patent Literatures 1 and 2 disclose the HUD device that combines light from semiconductor lasers with three wavelengths and that displays a virtual image.

In the HUD device, in order to generate desired colored light with good color reproducibility and display a virtual image, it is necessary to properly set the power balance of beams that are emitted from the semiconductor lasers on the basis of the wavelengths of the beams that are emitted from the semiconductor lasers with three wavelengths.

However, particularly in the case of use of semiconductor lasers that oscillate in the longitudinal multimode, if the wavelength for determining the power balance is not properly set, it is difficult to generate colored light with good reproducibility.

Therefore, after a diligent consideration, the inventor has found out that, if the semiconductor laser which oscillates in the longitudinal multimode, is used in the HUD device, the semiconductor laser can be treated as if the semiconductor laser performs longitudinal single mode oscillation, depending on the wavelength band, and the power balance for color generation can be accurately determined using a wavelength in the wavelength band, and this technical idea has been implemented as the above-described embodiment and the modified examples.

REFERENCE SIGNS LIST

15 Optical deflector (image forming element)
30 Screen
40 Concave mirror (projecting unit)
50 Front windshield (transmissive reflective member)
100 HUD device (image display device)
114 Optical-path combining element (part of a light combining unit)
115 Optical-path combining element (part of the light combining unit, a light branching unit)
111R, 111G, 111B Semiconductor laser
300 Light source device
**700*a*** Proxy-wavelength calculating unit (part of a control unit)
**700*b*** Power-balance determining unit (part of the control unit)
**700*c*** Modulation-signal generating unit (part of the control unit)

CITATION LIST

Patent Literature

PTL 1: Japanese Patent No. 5304380
PTL 2: Japanese Laid-open Patent Publication No. 2015-148665

The invention claimed is:

1. A light source device, comprising:
a plurality of semiconductor lasers having different oscillation wavelengths; and
at least one optical path combiner to combine light from the plurality of semiconductor lasers to generate colored light, wherein:
each of the semiconductor lasers oscillates in a longitudinal multimode and has a wavelength band, within which an intensity is equal to or more than −20 dB relative to a peak intensity in a spectrum distribution of output light, having a width equal to or less than 15 nm.

2. The light source device according to claim 1, further comprising:
wavelength estimating circuitry configured to estimate a wavelength λ, of light from each of the semiconductor lasers; and
emission-light intensity setting circuitry configured to set an emission light intensity of each of the semiconductor lasers in accordance with an estimation result by the wavelength estimating circuitry.

3. The light source device according to claim 2, wherein if wavelengths included in the wavelength band are $\lambda_1$, $\lambda_2$, $\lambda_3$, . . . , $\lambda_n$ and intensities corresponding to the wavelengths in a spectrum are $I_1, I_2, I_3, \ldots, I_n$, $\lambda=\Sigma(\lambda_k*I_k)/\Sigma(I_k)$ (where k=1, 2, 3, . . . , n) is satisfied.

4. The light source device according to claim 2, wherein the wavelength estimating circuitry includes:

a light receiver to receive light from each of the semiconductor lasers;

a temperature sensor to measure an ambient temperature around each of the semiconductor lasers; and estimating circuitry configured to estimate the wavelength λ of light from each of the semiconductor lasers based on a received light intensity by the light receiver and a measured temperature by the temperature sensor.

5. The light source device according to claim 4, further comprising:

a light splitter on an optical path of light from each of the semiconductor lasers, wherein the light receiving element is disposed on an optical path of light that has passed the light splitter.

6. An image forming apparatus comprising:

the light source device according to claim 2; and an image forming element to form an image with light from the light source device.

7. An image display device comprising:

the image forming apparatus according to claim 6; and a screen to be irradiated with light that has passed the image forming element in the image forming apparatus.

8. The image display device according to claim 7, further comprising a projector configured to project light which has passed the screen, toward a transmissive reflective surface.

9. An object device comprising:

the image display device according to claim 7; and an object in which the image display device is installed.

10. The object device according to claim 9, wherein the object is a movable body.

11. A colored-light generation method for generating colored light using the plurality of semiconductor lasers included in the light source device according to claim 1, the colored-light generation method comprising:

turning on the plurality of semiconductor lasers; and combining light from the plurality of semiconductor lasers.

12. The colored-light generation method according to claim 11, further comprising:

estimating a wavelength λ of light from the plurality of semiconductor lasers; and setting emission light intensities of the plurality of semiconductor lasers in accordance with an estimation result in the estimating.

13. The colored-light generation method according to claim 12, wherein if wavelengths included in the wavelength band are $\lambda_1, \lambda_2, \lambda_3, \ldots, \lambda_n$ and intensities corresponding to the wavelengths in a spectrum are $I_1, I_2, I_3, \ldots, I_n$, $\lambda=\Sigma(\lambda_k*I_k)/\Sigma(I_k)$ (where k=1, 2, 3, . . . , n) is satisfied.

14. A colored-light generation method for generating colored light using the light source device according to claim 1, the colored-light generation method comprising:

turning on each of the semiconductor lasers;

estimating a wavelength λ of light from each of the semiconductor lasers; and setting an emission light intensity of each of the semiconductor lasers in accordance with an estimation result in the estimating.

15. The colored-light generation method according to claim 14, wherein if wavelengths included in the wavelength band are $\lambda_1, \lambda_2, \lambda_3, \ldots, \lambda_n$ and intensities corresponding to the wavelengths in a spectrum are $I_1, I_2, I_3, \ldots, I_n$, $\lambda=\Sigma(\lambda_k*I_k)/\Sigma(I_k)$ (where k=1, 2, 3, . . . , n) is satisfied.

16. The image forming apparatus according to claim 6, wherein the image forming element comprises an optical deflector.

17. The light source device according to claim 1, wherein:

the at least one optical path combiner includes a dichroic mirror.

18. The light source device according to claim 1, wherein:

the at least one optical path combiner includes two dichroic mirrors.

19. The light source device according to claim 5, wherein:

the light splitter and one of the at least one optical path combiner is a same element.

* * * * *